(12) United States Patent
Yilmaz et al.

(10) Patent No.: US 10,958,019 B2
(45) Date of Patent: Mar. 23, 2021

(54) SMART AND ROBUST WALL SOCKET WITH INTEGRATED UNIVERSAL SERIAL BUS (USB)

(71) Applicant: Computime, Ltd., Queensway (HK)

(72) Inventors: Hamza Yilmaz, Gilroy, CA (US); Hung Bun Choi, China (HK); Michael Ho, Shen Zhen (CN); Jerry Xu, Shen Zhen (CN); FP Zhou, Shen Zhen (CN); Tom Tao, Shen Zhen (CN); ZH Chen, Shen Zhen (CN); Kevin Liu, Shen Zhen (CN)

(73) Assignee: Computime Ltd., New Territories (HK)

( * ) Notice: Subject to any disclaimer, the term of this patent is extended or adjusted under 35 U.S.C. 154(b) by 23 days.

(21) Appl. No.: 15/985,187

(22) Filed: May 21, 2018

(65) Prior Publication Data
US 2019/0067883 A1 Feb. 28, 2019

Related U.S. Application Data

(60) Provisional application No. 62/551,334, filed on Aug. 29, 2017.

(51) Int. Cl.
*H01R 13/66* (2006.01)
*H01R 13/713* (2006.01)
(Continued)

(52) U.S. Cl.
CPC ..... *H01R 13/6675* (2013.01); *H01R 13/6683* (2013.01); *H01R 13/6691* (2013.01);
(Continued)

(58) Field of Classification Search
CPC ............ H01R 13/6675; H01R 13/6683; H01R 13/6691; H01R 25/006; H01R 13/713; H05K 1/14; H02J 7/0052
See application file for complete search history.

(56) References Cited

U.S. PATENT DOCUMENTS 7,783,910 B2 * 8/2010 Felter ........................ G06F 1/28
713/300
9,201,481 B2 * 12/2015 Hirosaka ................ G06F 1/266
(Continued)

FOREIGN PATENT DOCUMENTS

KR 101601141 B1 3/2016
TW 201426675 A 7/2014

OTHER PUBLICATIONS

Dec. 19, 2018—(EP) Partial European Search Report—App EP18190287.
(Continued)

*Primary Examiner* — Daniel Kessie
(74) *Attorney, Agent, or Firm* — Banner & Witcoff, Ltd.

(57) ABSTRACT

A smart electrical plug supports one or more electrical outlets and one or more universal serial bus (USB) outlets for charging electrical devices. Electrical power consumed through the one or more electrical outlets may be measured individually or in combination and reported via a wireless communication channel. The smart electrical plug may be implemented by a plurality of printed circuit board assemblies and distributed within a housing to reduce the effects of heat dissipation. The smart electrical plug may further reduce heat dissipation by utilizing one or more electrical circuit approaches.

13 Claims, 28 Drawing Sheets

(51) Int. Cl.
*H01R 25/00* (2006.01)
*H05K 1/14* (2006.01)
*H02J 3/14* (2006.01)
*H05K 5/00* (2006.01)
*G01R 19/25* (2006.01)
*H01R 27/02* (2006.01)
*H02J 7/00* (2006.01)

(52) U.S. Cl.
CPC ......... *H01R 13/713* (2013.01); *H01R 25/006* (2013.01); *H02J 3/14* (2013.01); *H05K 1/14* (2013.01); *G01R 19/2513* (2013.01); *H01R 13/7137* (2013.01); *H01R 27/02* (2013.01); *H02J 7/00* (2013.01); *H02J 2310/14* (2020.01); *H05K 5/0026* (2013.01); *H05K 2201/1003* (2013.01); *H05K 2201/10053* (2013.01); *H05K 2201/10151* (2013.01); *H05K 2201/10189* (2013.01); *H05K 2201/10325* (2013.01)

(56) References Cited

U.S. PATENT DOCUMENTS

| | | | | |
|---|---|---|---|---|
| 9,577,473 | B2* | 2/2017 | Dawley | H02J 3/14 |
| 9,952,261 | B2* | 4/2018 | Ewing | H04Q 9/00 |
| 10,433,455 | B2* | 10/2019 | Jansen | H02G 3/03 |
| 2008/0140565 | A1* | 6/2008 | DeBenedetti | G06Q 20/10 |
| | | | | 705/39 |
| 2009/0251127 | A1* | 10/2009 | Kim | H02J 3/14 |
| | | | | 324/76.11 |
| 2009/0322159 | A1* | 12/2009 | DuBose | H02J 9/005 |
| | | | | 307/117 |
| 2010/0328849 | A1* | 12/2010 | Ewing | G06F 1/266 |
| | | | | 361/622 |
| 2011/0022242 | A1 | 1/2011 | Bukhin et al. | |
| 2012/0060044 | A1 | 3/2012 | Jonsson et al. | |
| 2014/0236372 | A1* | 8/2014 | Ewing | H04L 12/10 |
| | | | | 700/295 |
| 2015/0070808 | A1* | 3/2015 | Avery | H01H 47/00 |
| | | | | 361/170 |
| 2015/0255932 | A1 | 9/2015 | Dicks et al. | |
| 2016/0164288 | A1 | 6/2016 | Yang et al. | |
| 2018/0366885 | A1* | 12/2018 | Hewitt | H01R 13/713 |

OTHER PUBLICATIONS

Mar. 22, 2019—(EP) European Search Report—App EP 18190287.5.
May 8, 2020—First Examination Report for EP 18190287.5.
Blanco-Novoa et al., "An Electricity Price-Aware Open-Source Smart Socket for the Internet of Energy," Sensors, vol. 17 No. 3, pp. 643-677 (Mar. 21, 2017).
Dec. 17, 2020—EP Examination Report—App. No. 18190287.5.
Jan. 8, 2021—TW Office Action—App. No. 107125547.

* cited by examiner

SMART AND ROBUST WALL SOCKET WITH INTEGRATED UNIVERSAL SERIAL BUS (USB)

This patent application claims priority to U.S. provisional patent application Ser. No. 62/551,334 entitled "Smart and Robust Wall Socket with Integrated Universal Serial Bus (USB)" filed on Aug. 29, 2017, which is hereby incorporated by reference in its entirety.

TECHNICAL FIELD

Aspects of the disclosure relate to a smart electrical plug that provides electrical power to an attached electrical device such as an appliance.

BACKGROUND OF THE INVENTION

A smart plug is typically a device that plugs right into an ordinary outlet and has its own outlet. An appliance may be plugged into the smart plug's outlet to obtain enhancements with respect to the ordinary electrical outlet. For example, a stuart plug may, via an app, enable a user to actively control it, automate it according to a time schedule, or trigger it from another electronic system.

Smart plugs may be a versatile building block of the smart home, with numerous uses for security, convenience, and energy savings. However, these capabilities typically require corresponding circuit complexity while supplying substantial electrical power under high and varying current loads to the attached appliance. Consequently, there is a real market need to provide a smart socket outlet to replace an ordinary socket outlet/smart plug in a smart home with a desired level of robustness. In this disclosure smart sockets outlets, smart outlets or smart sockets are interchangeably used such that the above terms refer to a smart socket outlet.

BRIEF DESCRIPTION OF THE DRAWINGS

The foregoing summary of the invention, as well as the following detailed description of exemplary embodiments of the invention, is better understood when read in conjunction with the accompanying drawings, which are included by way of example, and not by way of limitation with regard to the claimed invention.

DETAILED DESCRIPTION

Figure 1A:
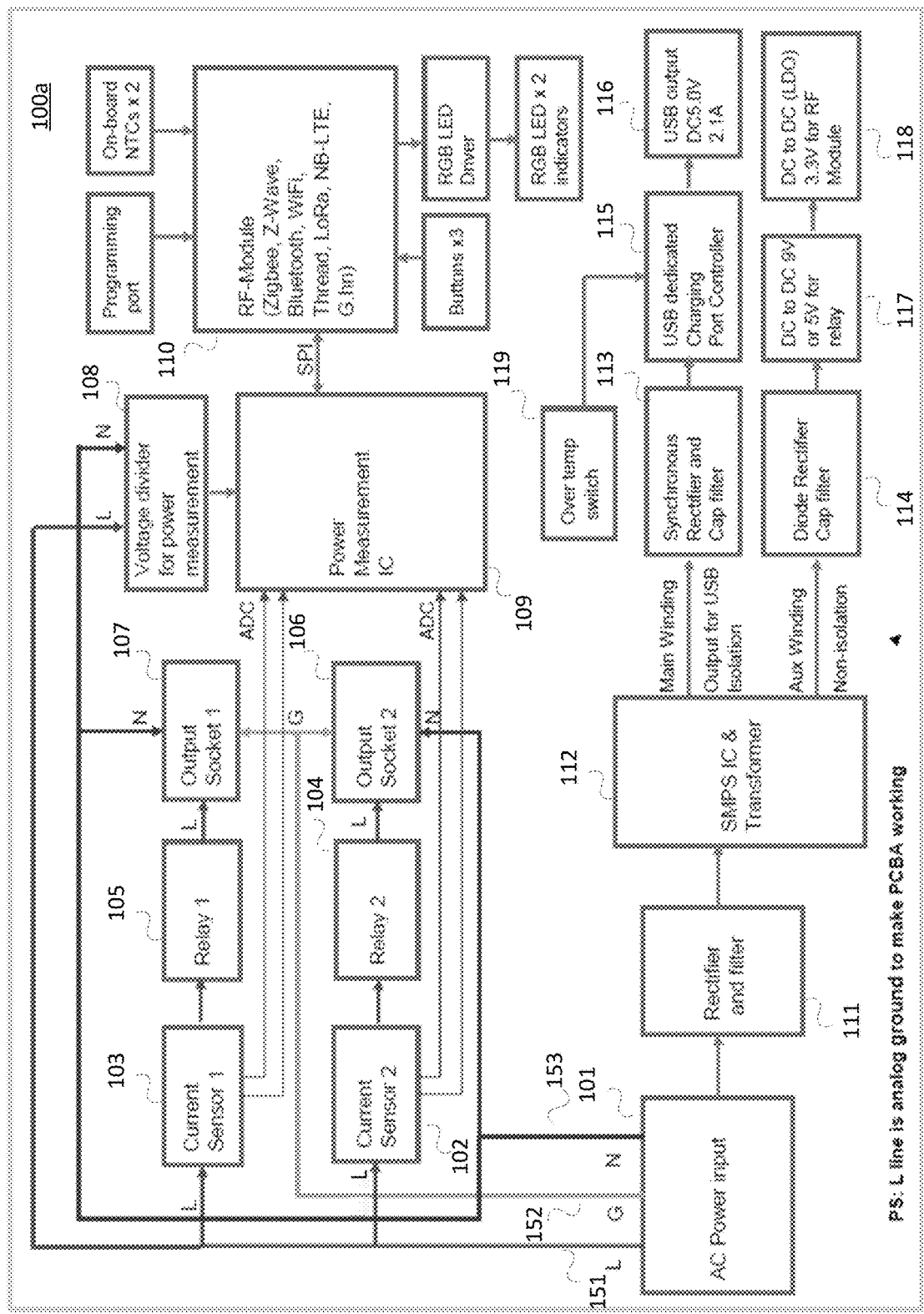
FIG. 1A shows a functional block of a smart outlet with both current sensor and relay on a Live (L) line in accordance with an embodiment.
Figure 1B:
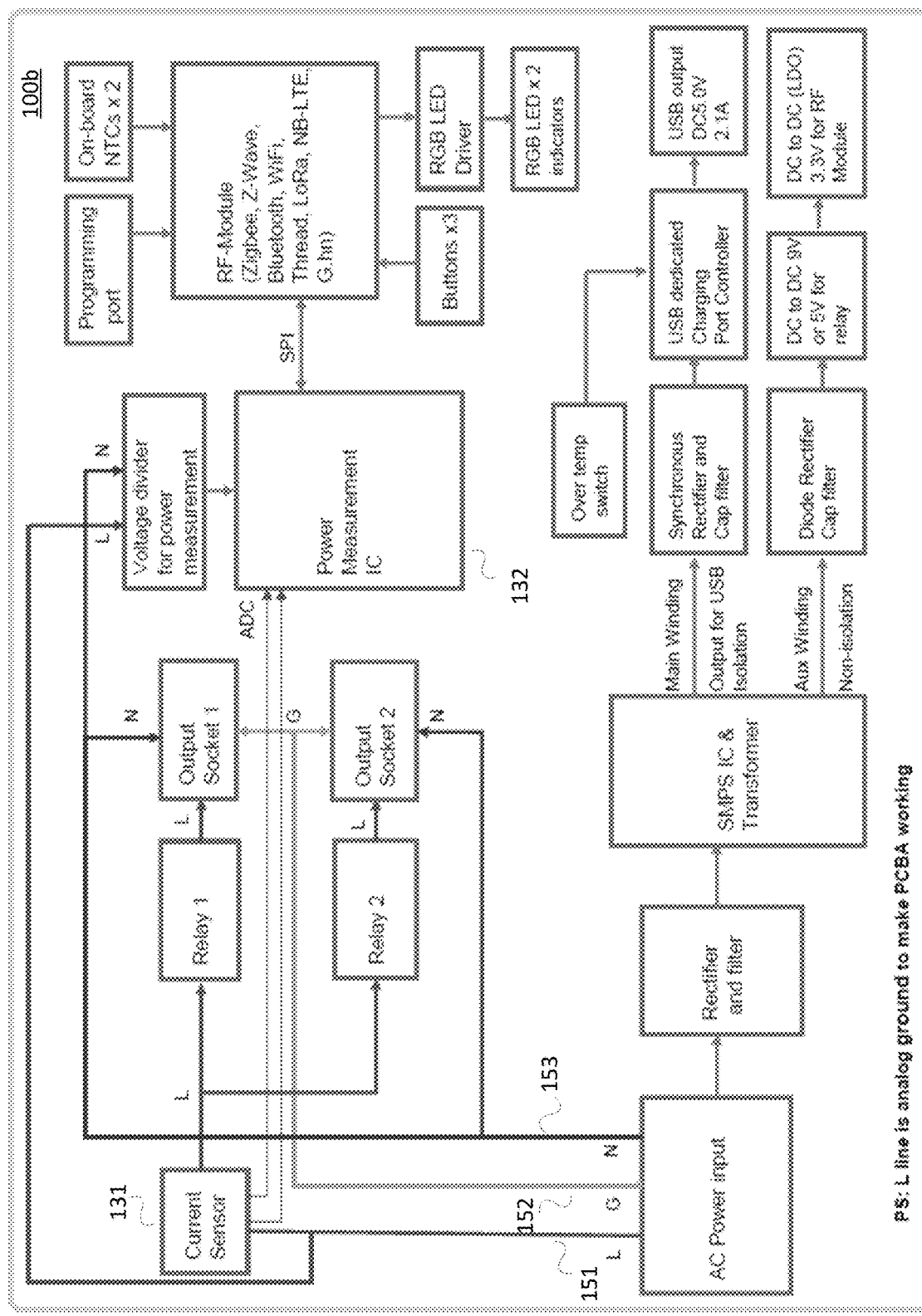
FIG. 1B shows an alternative functional block of a smart outlet with a current sensor and two relays on a Live (L) line in accordance with an embodiment.

FIGS. 1A-B show functional block diagrams $100a$ and $100b$, respectively, of a smart socket (smart electrical plug) in accordance with some embodiments. As well as achieving energy savings and connectivity, electric plugs and sockets may incorporate capabilities to measure usage of energy (power over a time duration), generate a wireless report, and control the energy usage. This may be referred to as a smart plug, smart socket, or smart outlet. With greater acceptance of smart devices in the future, additional functions may be integrated into plugs and sockets such as AC to DC conversion with USB outlets to directly charge portable electronics products such as mobile phones and IPADS. One major concern is the reduction of the temperature rise within the smart electrical plug to meet safety requirements and regulations. One aspect of the embodiments is enabling development of a smart wall mounted device with at least two power sockets with two or more USB charging sockets. The functional block diagrams of a smart socket according some embodiments are shown in FIGS. 1A-B.

In FIGS. 1A-B, both current sensor(s) and relays are placed on Live (L) line 151 having a compact PCB assembly.

Referring to FIG. 1A, electrical power is presented at AC power input 101 through Live (L) 151, Ground (G) line 152, and Neutral (N) line 153. With some embodiments, AC power input 101 comprises a three-prong arrangement that plugs into an existing wall electrical receptacle.

Smart socket $100a$ supports two electrical output sockets 106 and 107 that are electrically coupled to L line 151 through current sensor 102 and relay 104 and through current sensor 103 and relay 105, respectively. When excessive current (for example, above a predetermined level) is detected by current sensors 102 and 103, relays 104 and 105 may be instructed to open to provide electrical protection for smart socket $100a$.

Power measurement IC 109 determines the power consumption of devices connected to output sockets 106 and 107 from signals (indicative the electrical current) generated by current sensors 102 and 103 in conjunction a signal (indicative of the L line voltage level) through voltage divider 108.

Power measurement IC 109 provides power measurement information through RF module 110, which sends a signal over a wireless channel conveying this information. With some embodiments, power measurements may be converted to energy measurements by multiplying them by an appropriate time duration.

Smart electrical plug $100a$ obtains electrical power for its circuitry through rectifier/filter 111 and transformer 112.

Smart electrical plug 100a supports one or more USB outputs 116 through synchronous rectifier 113 and USB port controller 115. Electrical power for RF module 110 and relays 104 and 105 is obtained through diode rectifier 114 and DC converters 117 and 118.

Some embodiments may support temperature switch 119, which may be adjustable. When an internal temperature within smart electrical plug 100a is over a first predetermined temperature (for example, 70 degrees C.), temperature switch 119 generates a signal to USB port controller 115 to cut the USB output. Once the internal temperature drops below a second predetermined temperature (for example, 60 degrees C.), temperature switch 119 generates a signal to resume the USB output.

Figure 1C:
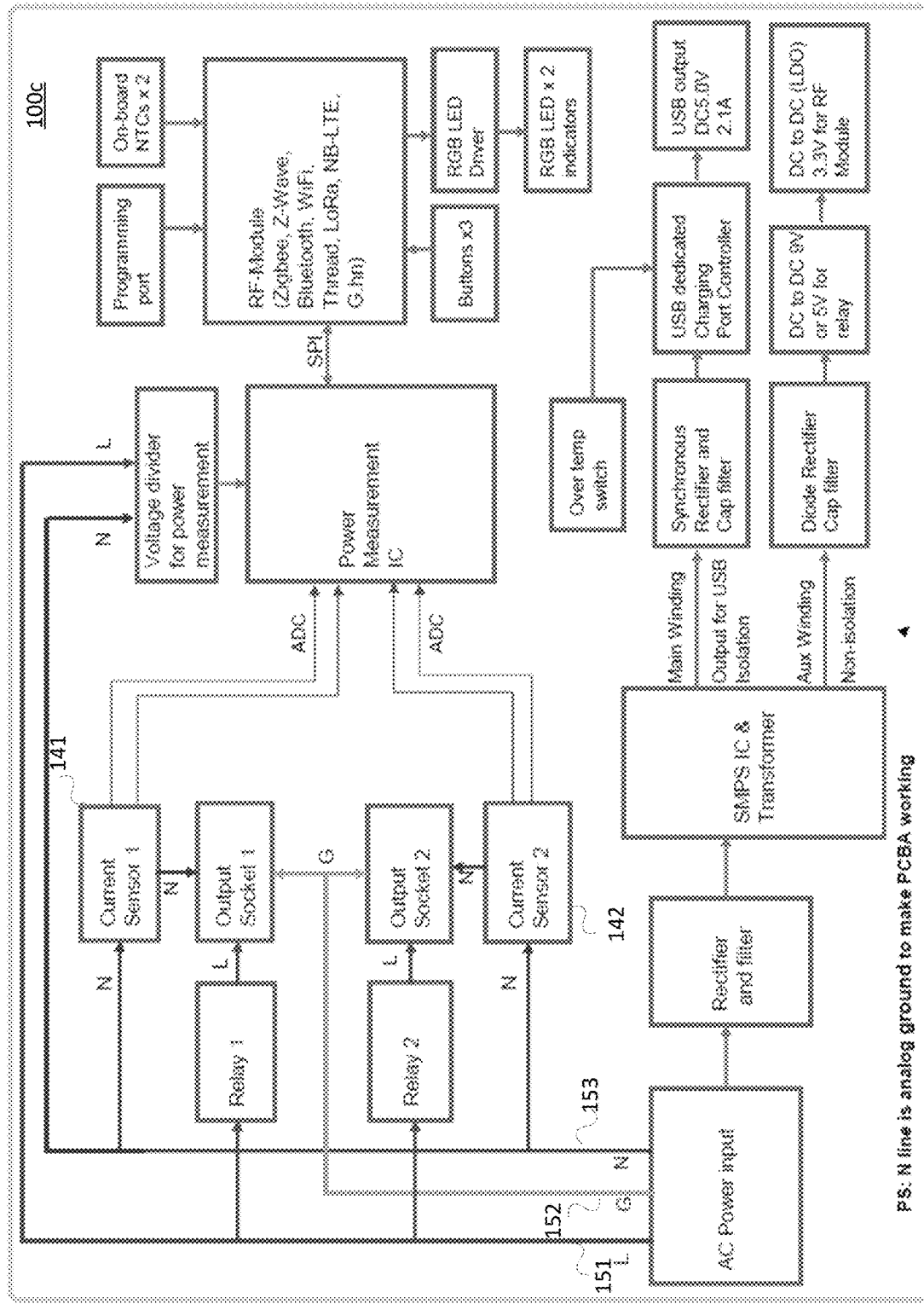
FIG. 1C shows a functional block of a smart socket with two current sensors on a Neutral (N) line and two relays on a Live (L) line in accordance with an embodiment.
Figure 1D:
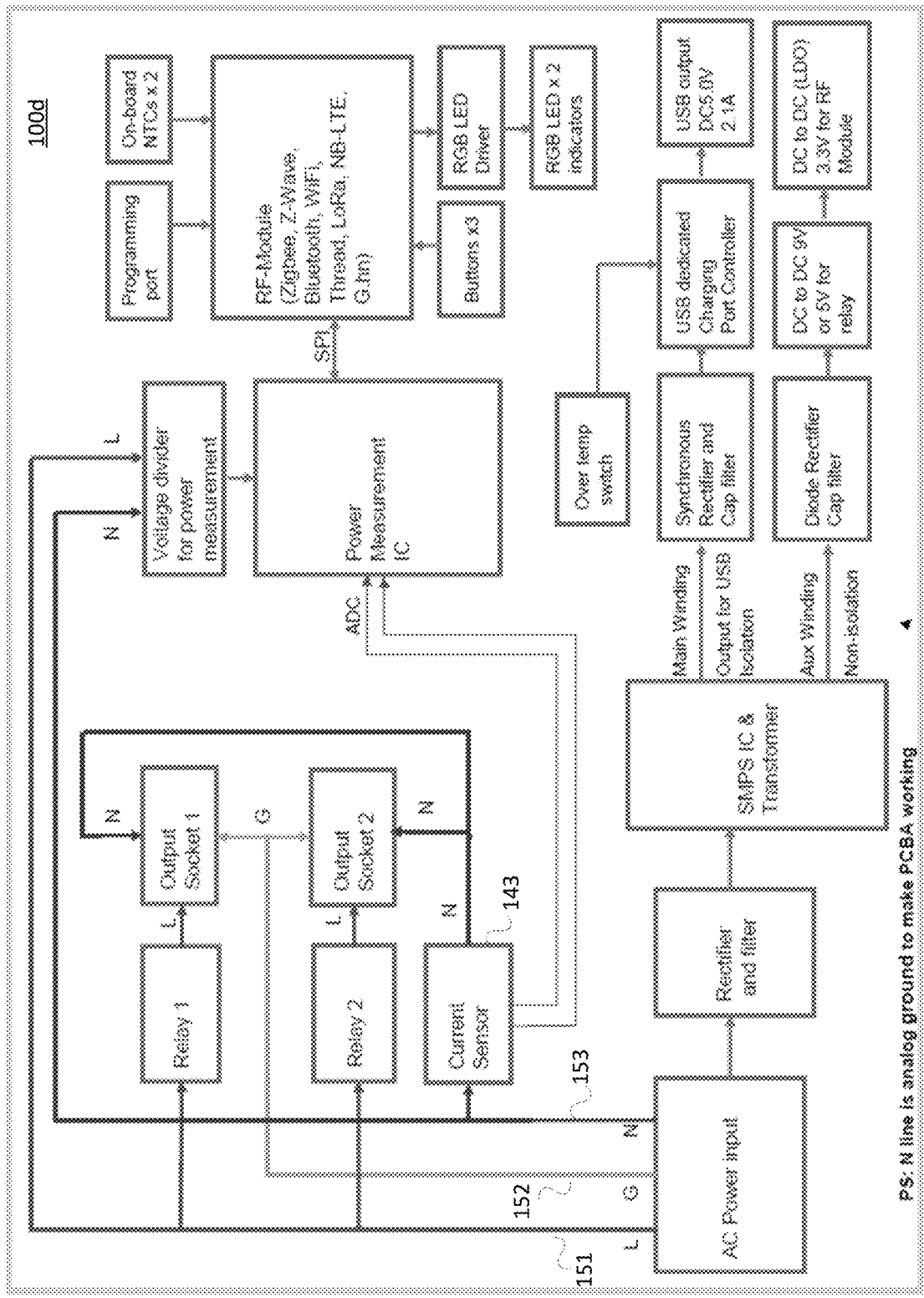
FIG. 1D shows an alternative functional block of a smart socket with a current sensor on a Neutral (N) line and two relays on Live (L) line in accordance with an embodiment.

With functional block diagrams 100c and 100d, as shown in FIGS. 1C-D, respectively, current sensors 141, 142, and 143 are placed on Neutral (N) line 153 and relays are placed on Live (L) line 151 to reduce power dissipation on Live (L) line 151 by moving the current sensor(s) from L line 151 to N line 153.

With the embodiments shown in FIGS. 1A and 1B, smart sockets are able to measure power/energy from each socket 106,107 (electrical outlet) with a single power measurement integrated circuit (IC) 109 with two channels and with synchronous rectifier 113 in the USB section to reduce power dissipation, thus reducing the temperature rise within the smart electrical plug. Referring to the embodiment shown in FIG. 1B, the smart socket has one single channel power measurement IC 132 with single current sensor 131 to report total energy usage from the socket.

Figure 2:
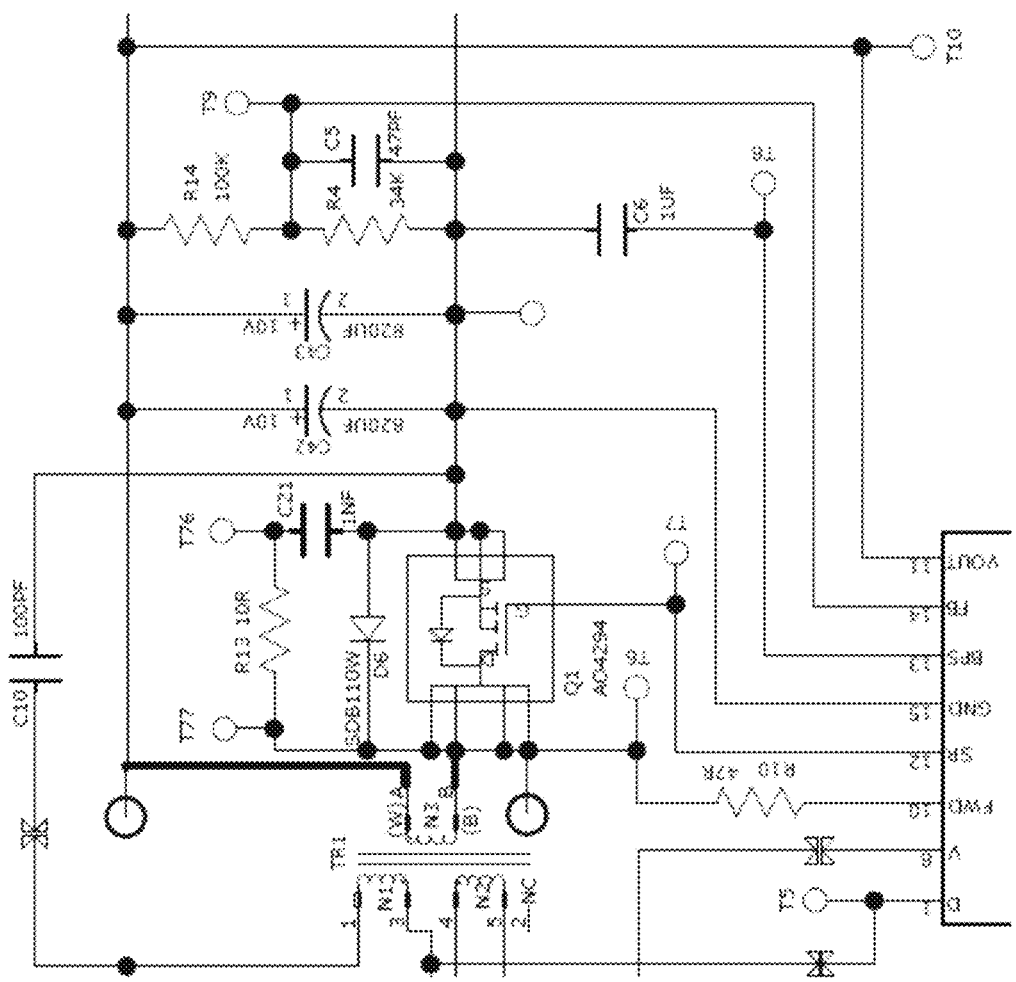
FIG. 2 shows a USB charging circuit that may incorporated into a smart socket in accordance with an embodiment.

With a USB charging circuit, according to traditional approaches, an incorporated Schottky diode is a major source of heat dissipation. With an aspect of the embodiments, a Schottky diode is replaced by synchronous rectifier circuit 200 as shown in FIG. 2. The power dissipation of a MOSFET is typically much lower than that of a Schottky diode.

With another aspect of the embodiments of a smart socket, in addition to a widest possible width of high current traces in the PCB's, copper sheets may be added in order to reduce the trace resistance to reduce power dissipation, resulting in lower heat generation.

With another aspect of the embodiments of a smart socket, shorten high current traces are as short as possible in accordance with three-dimensional PCBA construction as shown in FIGS. 3A-D.

With another aspect of the embodiments of a smart socket, a current sensing resistor (acting as a current sensor) has a lower value (for example, 0.25 mOhm) with respect to traditional approaches (typically in the range of 1 mOhm).

With another aspect of the embodiments of a smart socket, the power supply circuitry comprises a DC/DC converter rather than a low drop out (LDO) regulator that is used with traditional approaches.

With another aspect of the embodiments of a smart socket, the smart socket comprises relays with the lowest possible contact resistance.

Figure 3A:
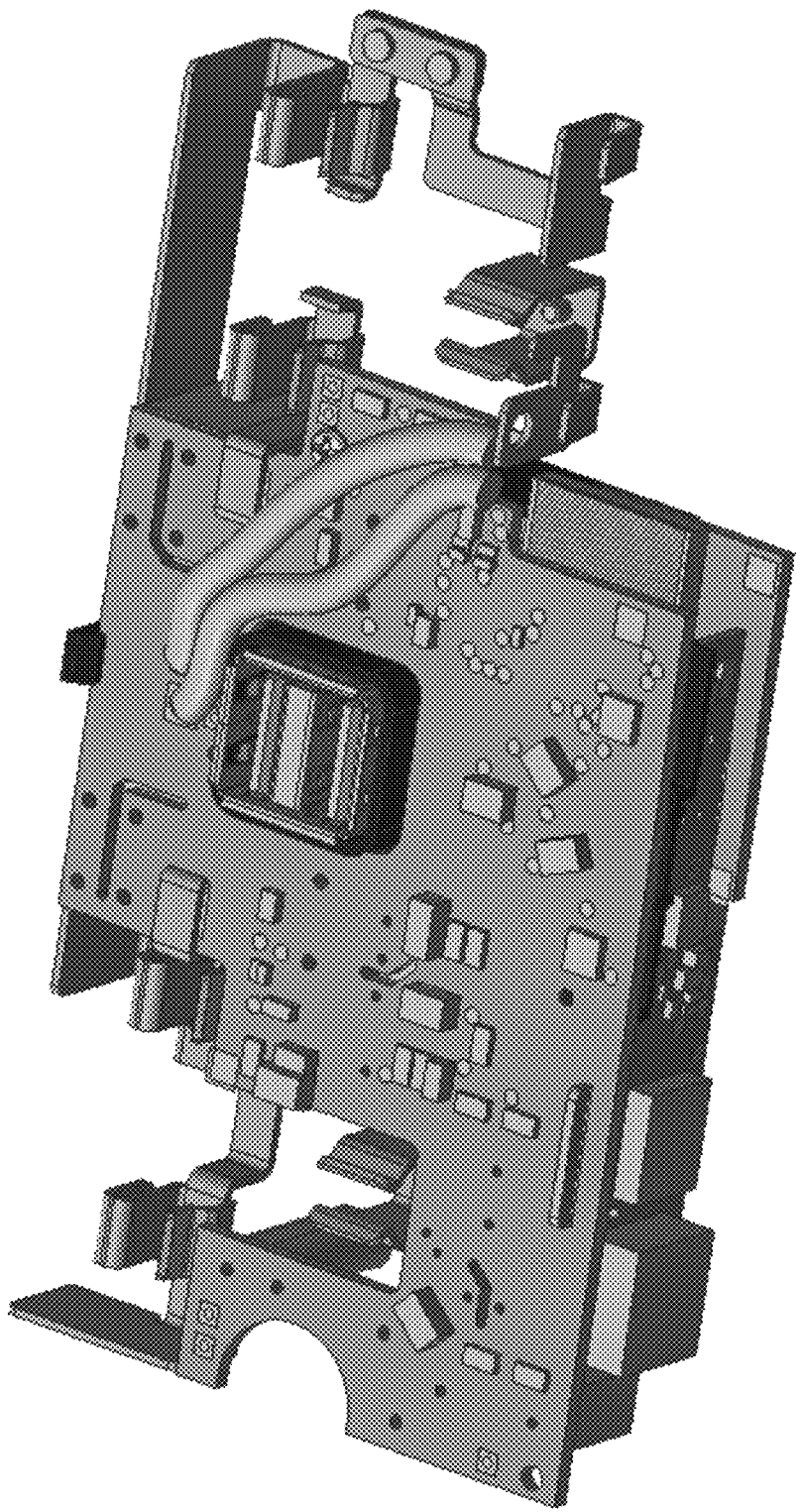
FIGS. 3A-D shows three-dimensional printed circuit board assemblies (PCBA's) for a smart socket in accordance with an embodiment.
Figure 3B:
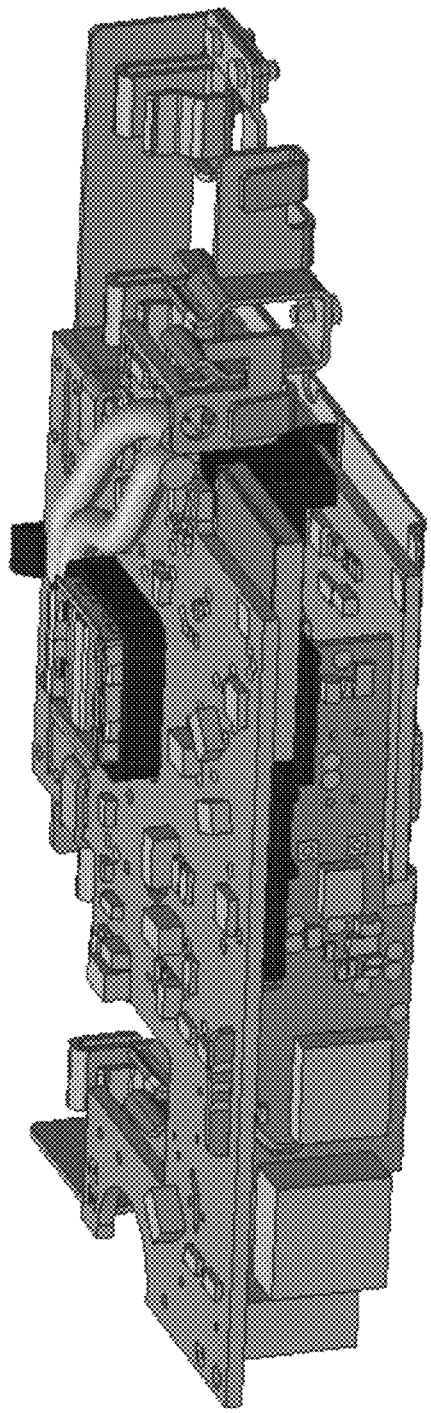
Figure 3C:
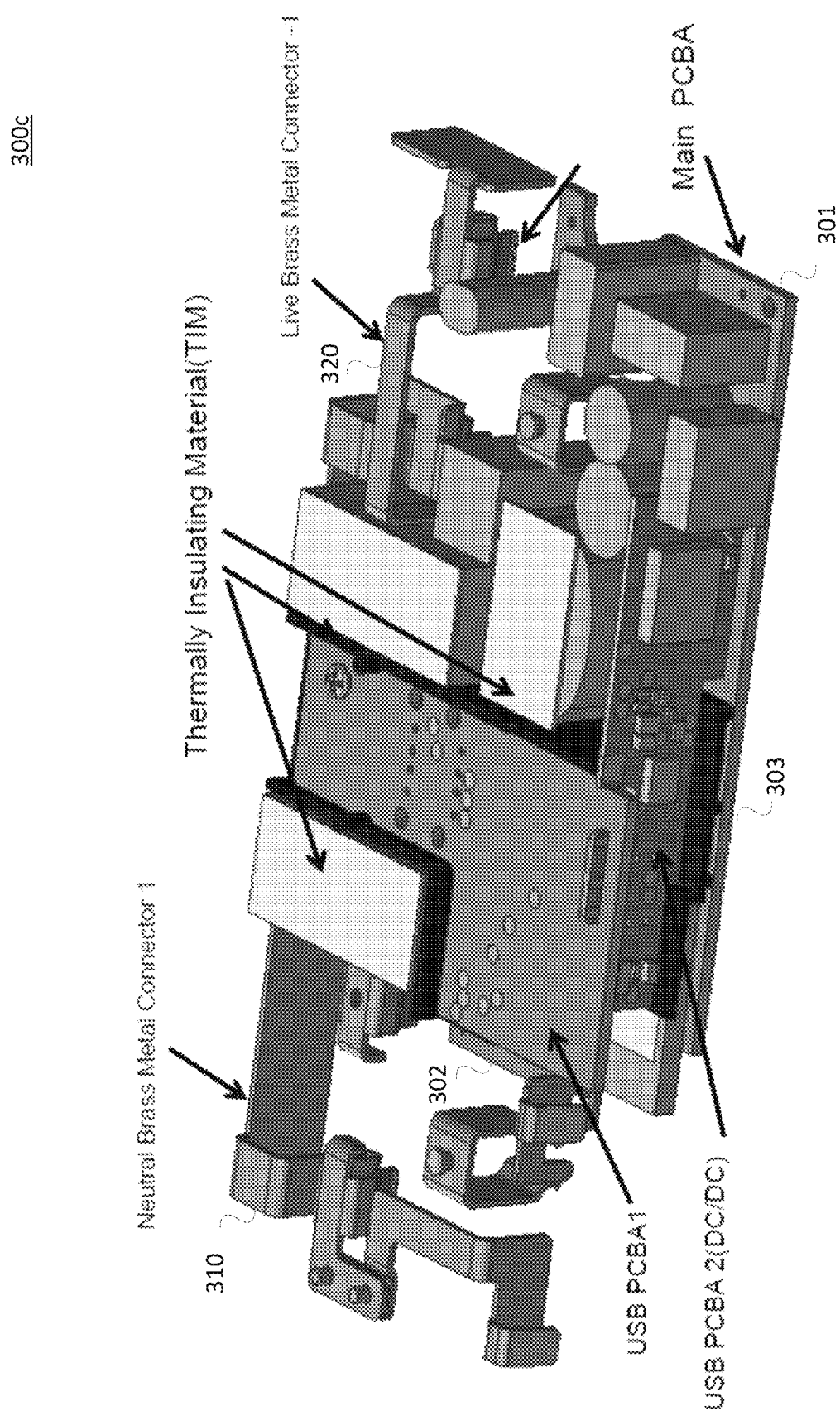
Figure 3D:
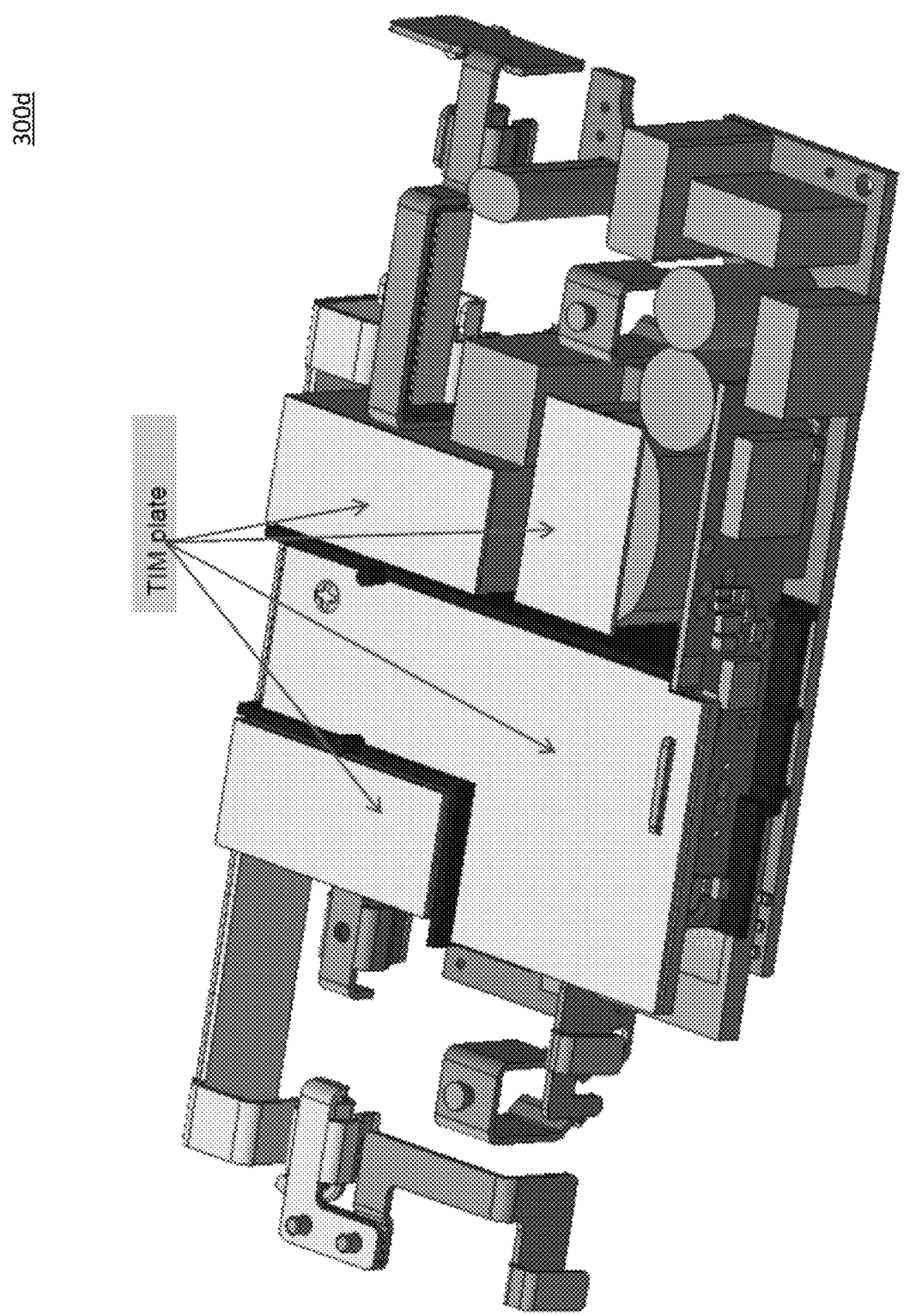

Referring to FIGS. 3A-D (corresponding to assemblies 300a-d, respectively), a smart socket with USB circuitry is assembled with three printed circuit board assemblies (PCBA's). With some embodiments, the smart socket comprises a separate transformer and a switch-mode power supply (SMPS) chipset to obtain improved heat dissipation with respect to traditional approaches. With some embodiments, relays and a transformer are organized so a heat sink may be incorporated from the backside of the smart socket. With some embodiments, a metal heat sink, as shown in the backside view in FIGS. 3C and 3D, is electrically insulated from the relays, transformer, capacitors, and other components with thermally insulating material (TIM) to avoid electrical short-circuiting.

With some embodiments, a smart electrical plug has smaller dimensions than with traditional approaches for comparable electrical characteristics. For example, with one embodiment a combined maximum current rating of first and second electrical output sockets is approximately 20 amperes, where the smart electrical plug has outside dimensions of approximately 148.3 mm (length)×87.8 mm (width)×29.3 mm (height). With the exemplary embodiment, the smart electrical plug has a current rating of approximately 13 amperes when an electrical load is present only at a single output socket.

Figure 3E:
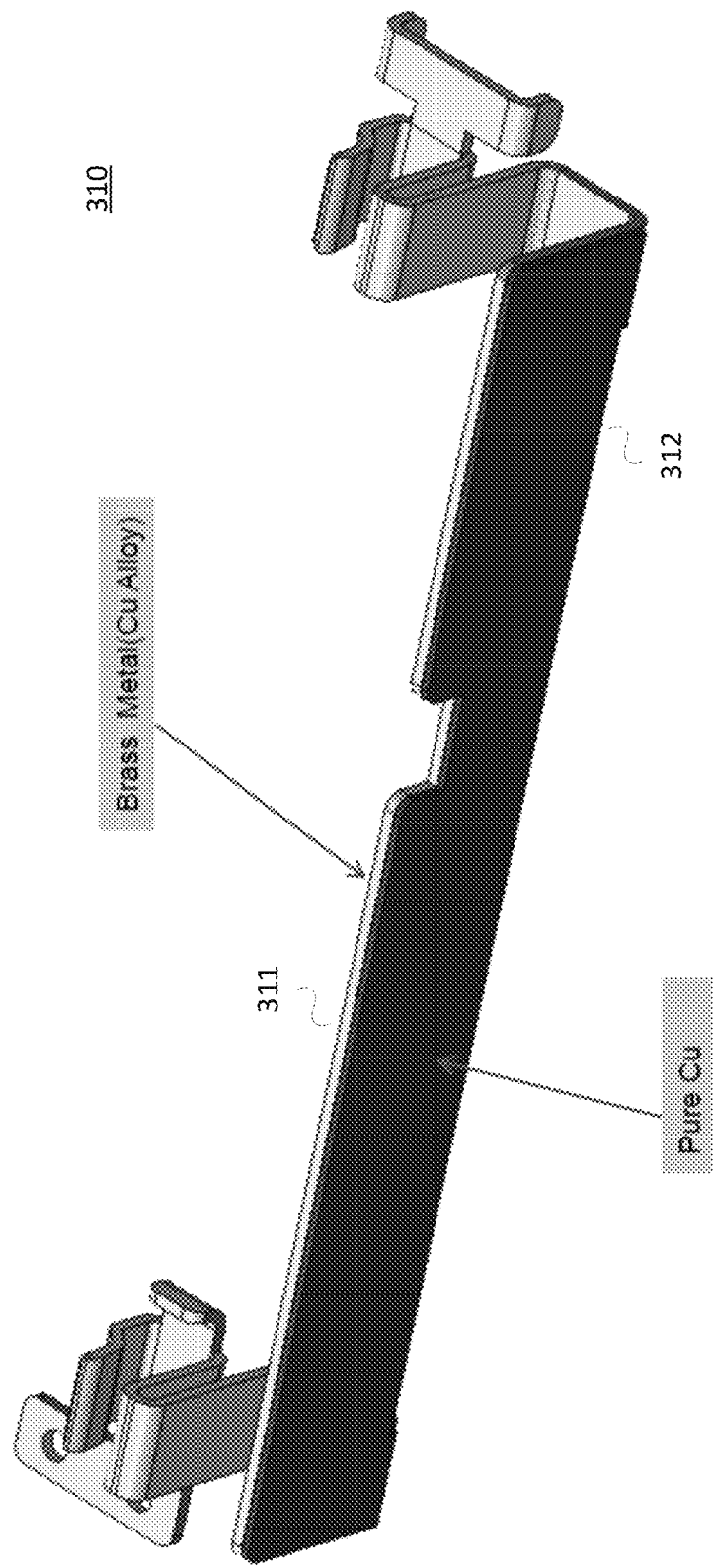
FIGS. 3E-G shows copper alloy (for example, brass) "neutral" (N) and "live" (L) metal bars with copper foil soldered to minimize resistance on these high current carrying regions in accordance with the current embodiment.
Figure 3F:
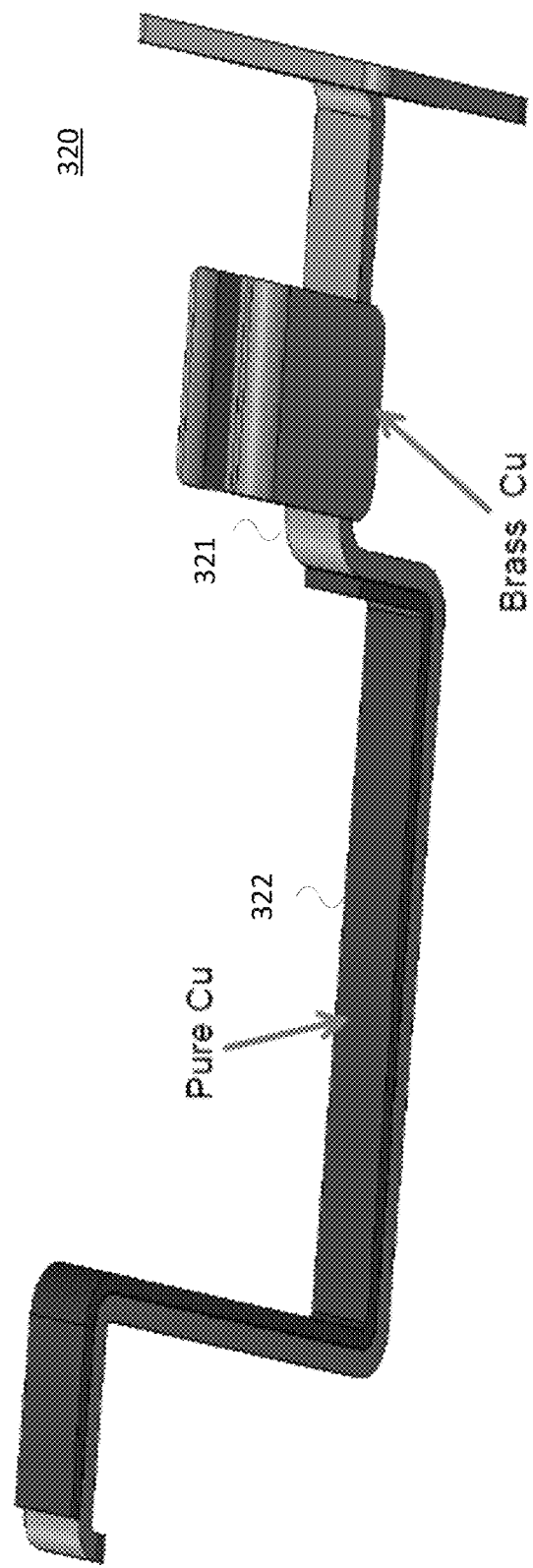
Figure 3G:
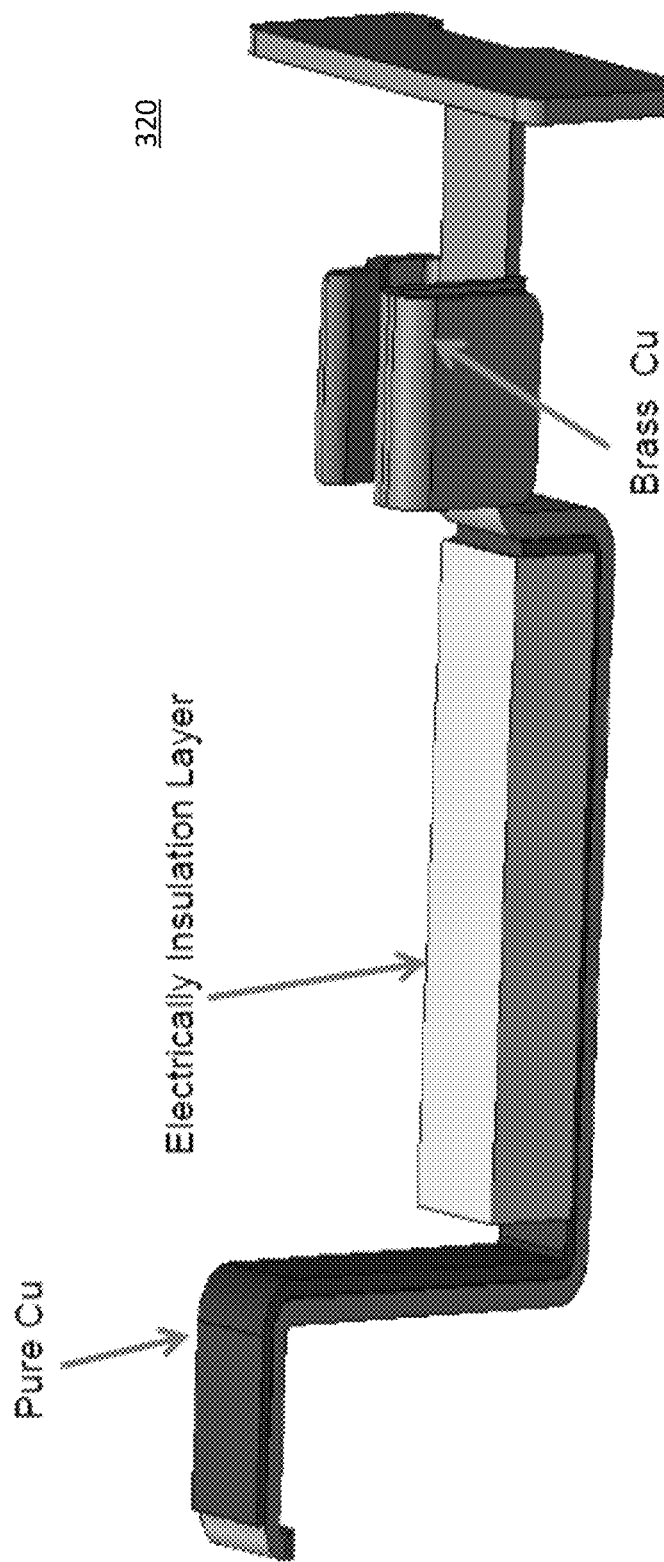

FIGS. 3E-G shows copper alloy (for example, brass) "neutral" (N) 310 and "live" (L) 320 metal bars with copper sheet or foil soldered to minimize resistance on these high current carrying regions in accordance with an embodiment. In another embodiment, regions with copper sheet (foil) regions can be made of copper bars and welded to brass socket insertion regions.

FIG. 3E shows metal bar 310 associated with N line 153. Bar 310 comprises brass metal strip 311 and copper foil 312.

FIG. 3F shows metal bar 320 associated with L line 151. Bar 320 comprises brass strip 321 and copper foil 322.

Details of the three printed circuit boards 400a-b (main PCBA), 500a-b (USB PCBA-1), and 600a-b (USB PCBA-2), as discussed above, are shown in FIGS. 4-6.

Figure 4A:
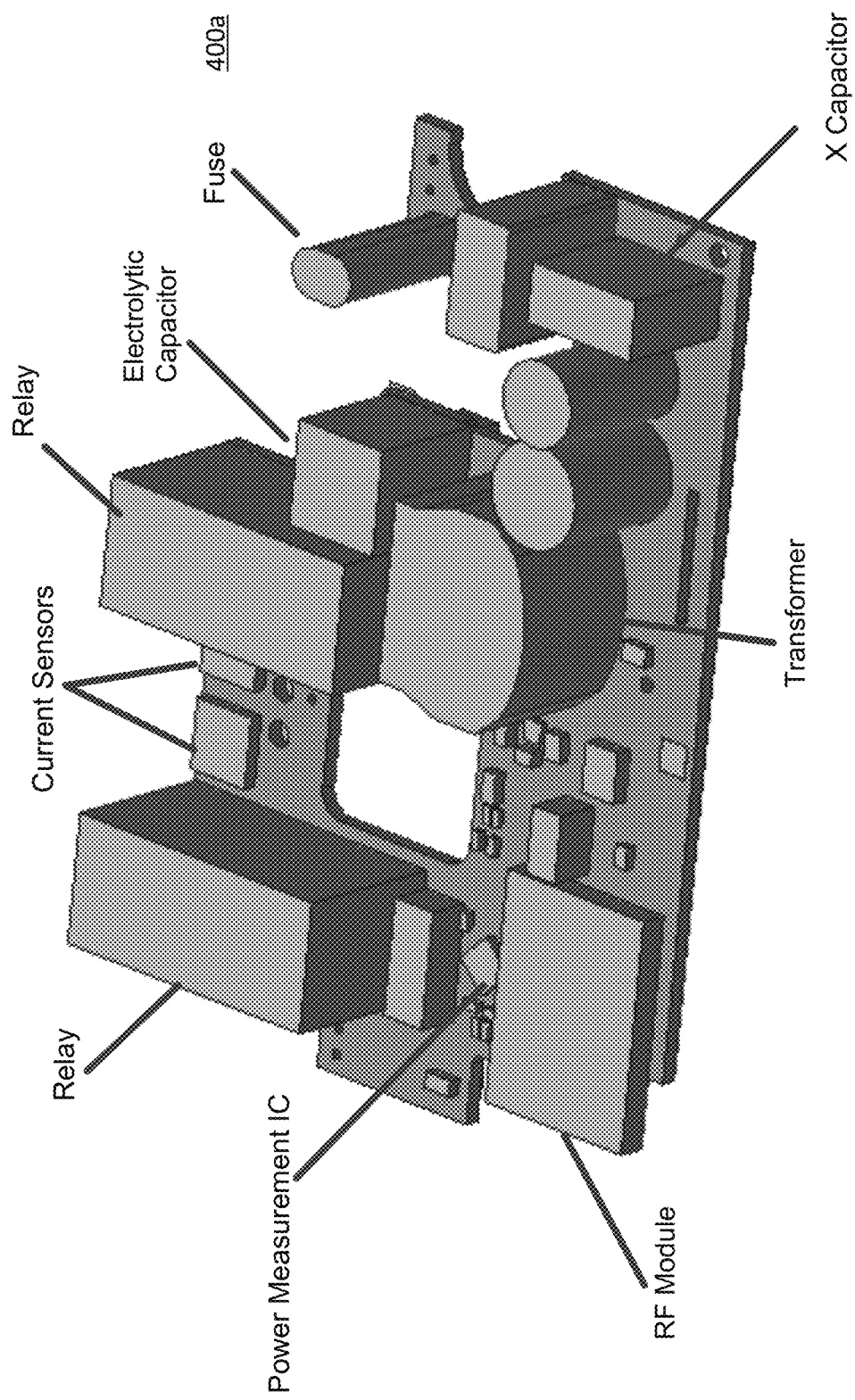
FIGS. 4A-B show top and backside views of a main PCBA for a smart socket in accordance with an embodiment.
Figure 4B:
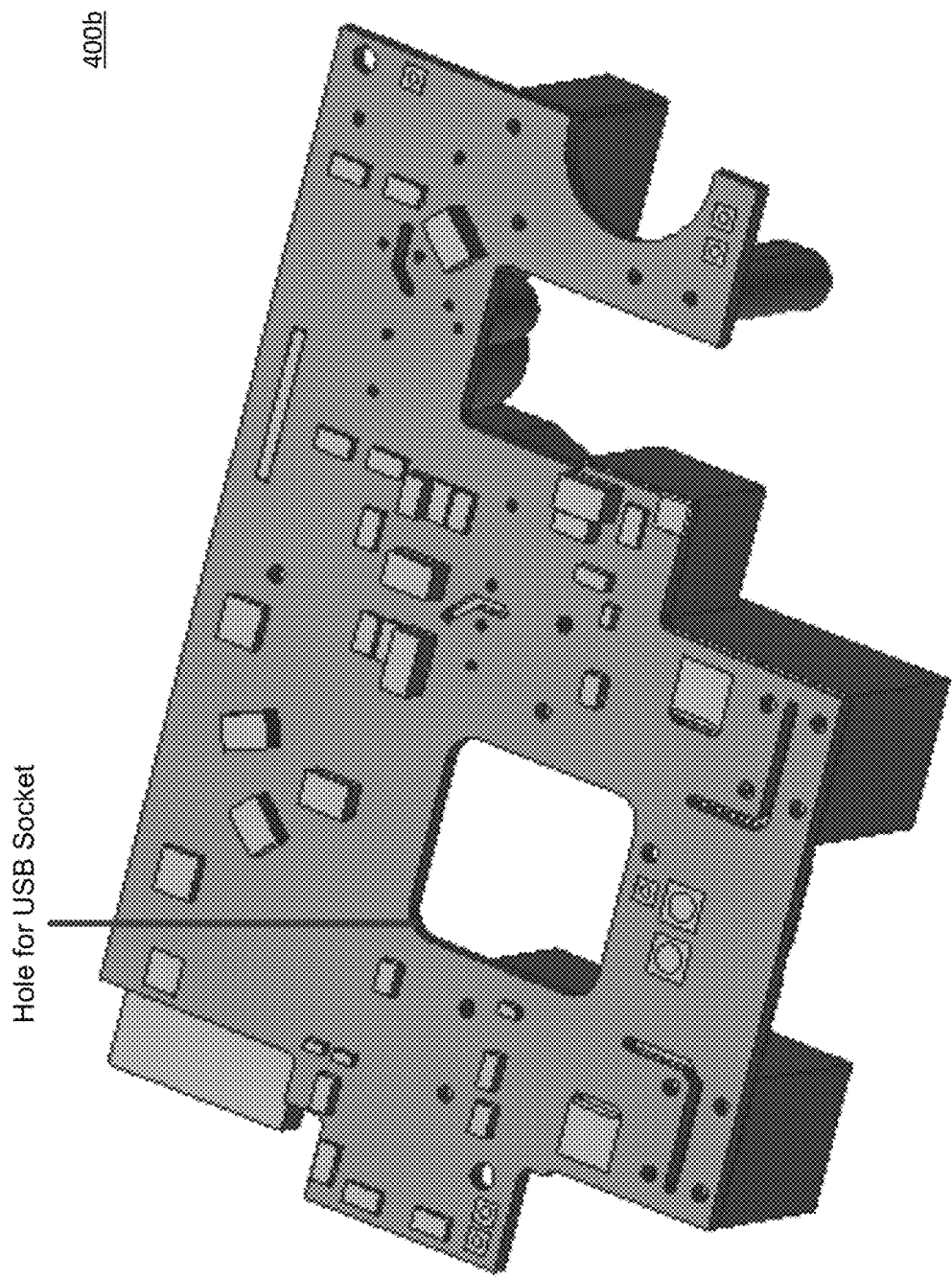
Figure 5A:
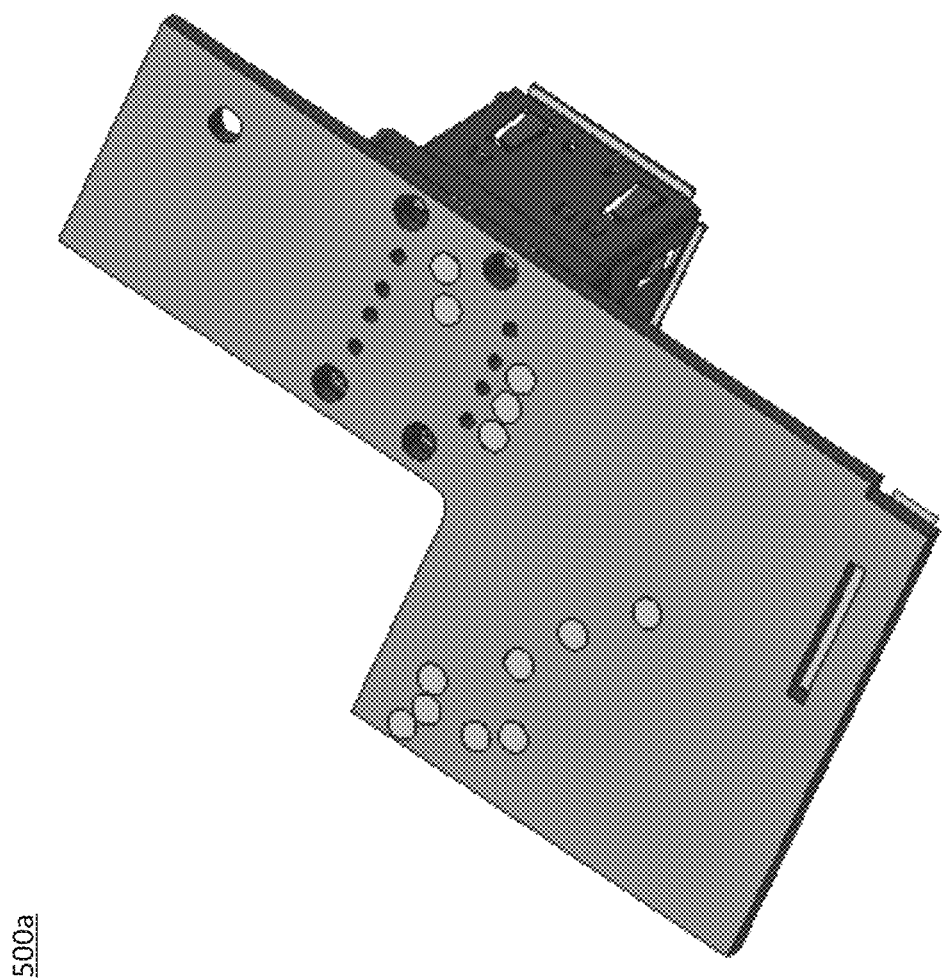
FIGS. 5A-B show top and backside views of a first USB PCBA in accordance with an embodiment.
Figure 5B:
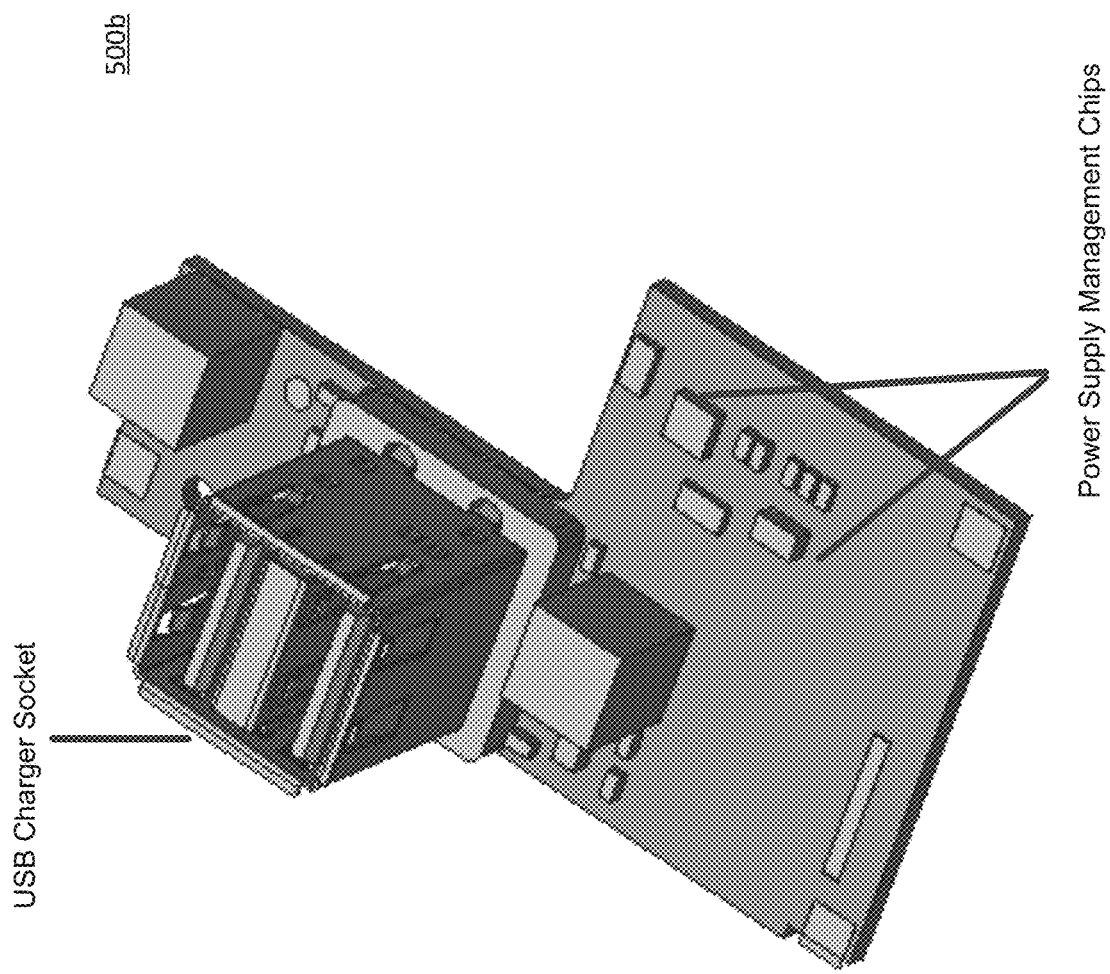
Figure 6A:
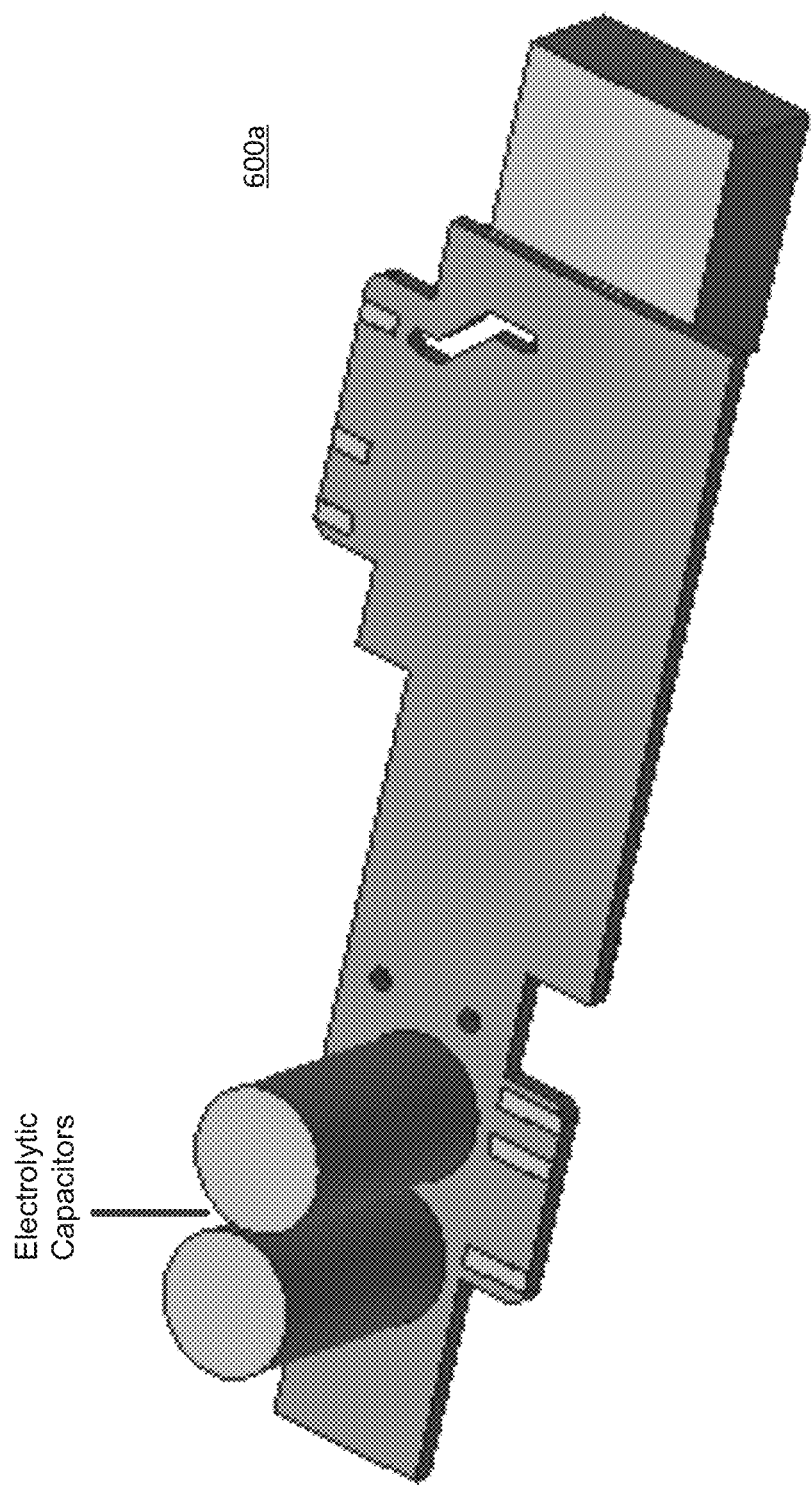
FIGS. 6A-B show top and backside views of a second USB PCBA with a DC/DC converter in accordance with an embodiment.
Figure 6B:
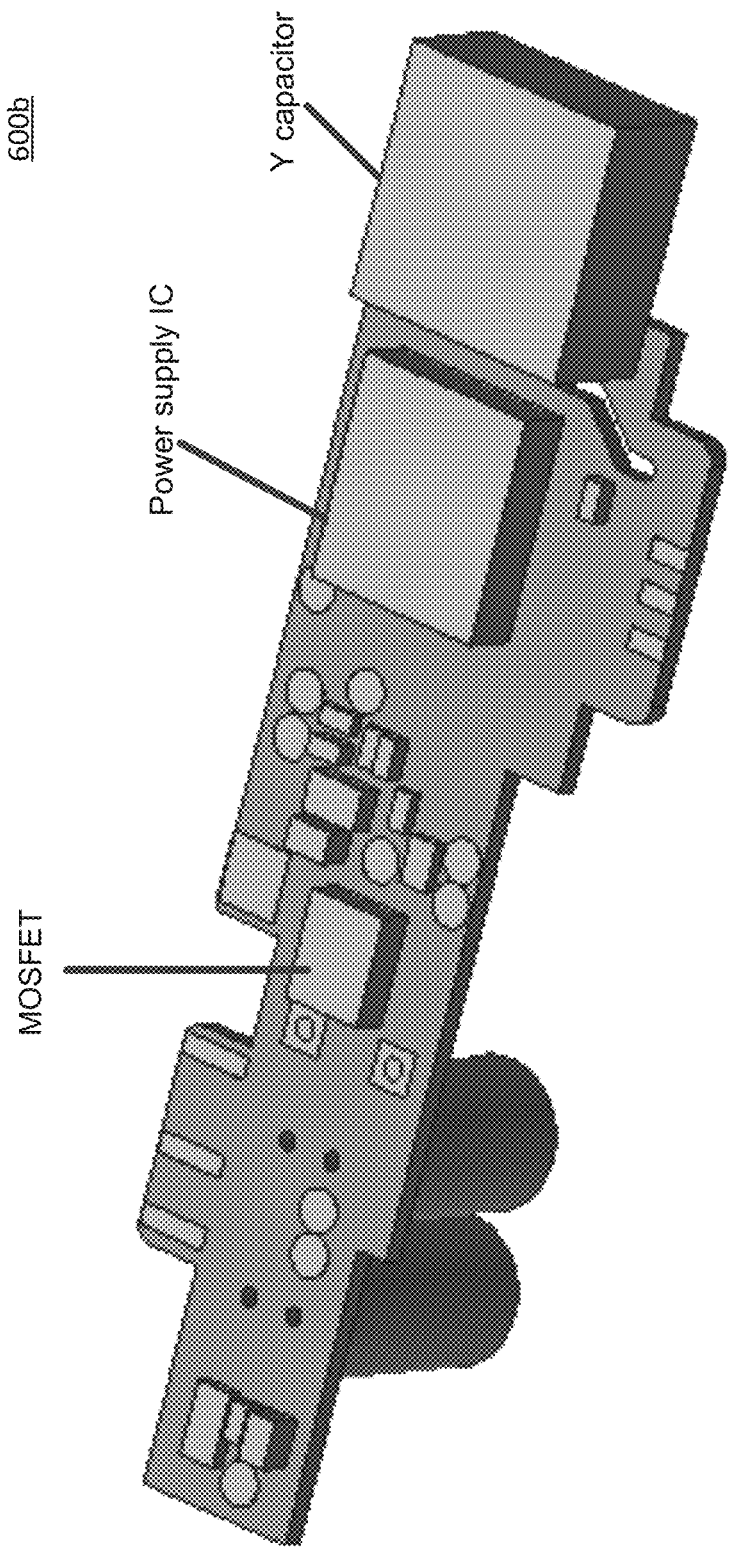
Figure 7A:
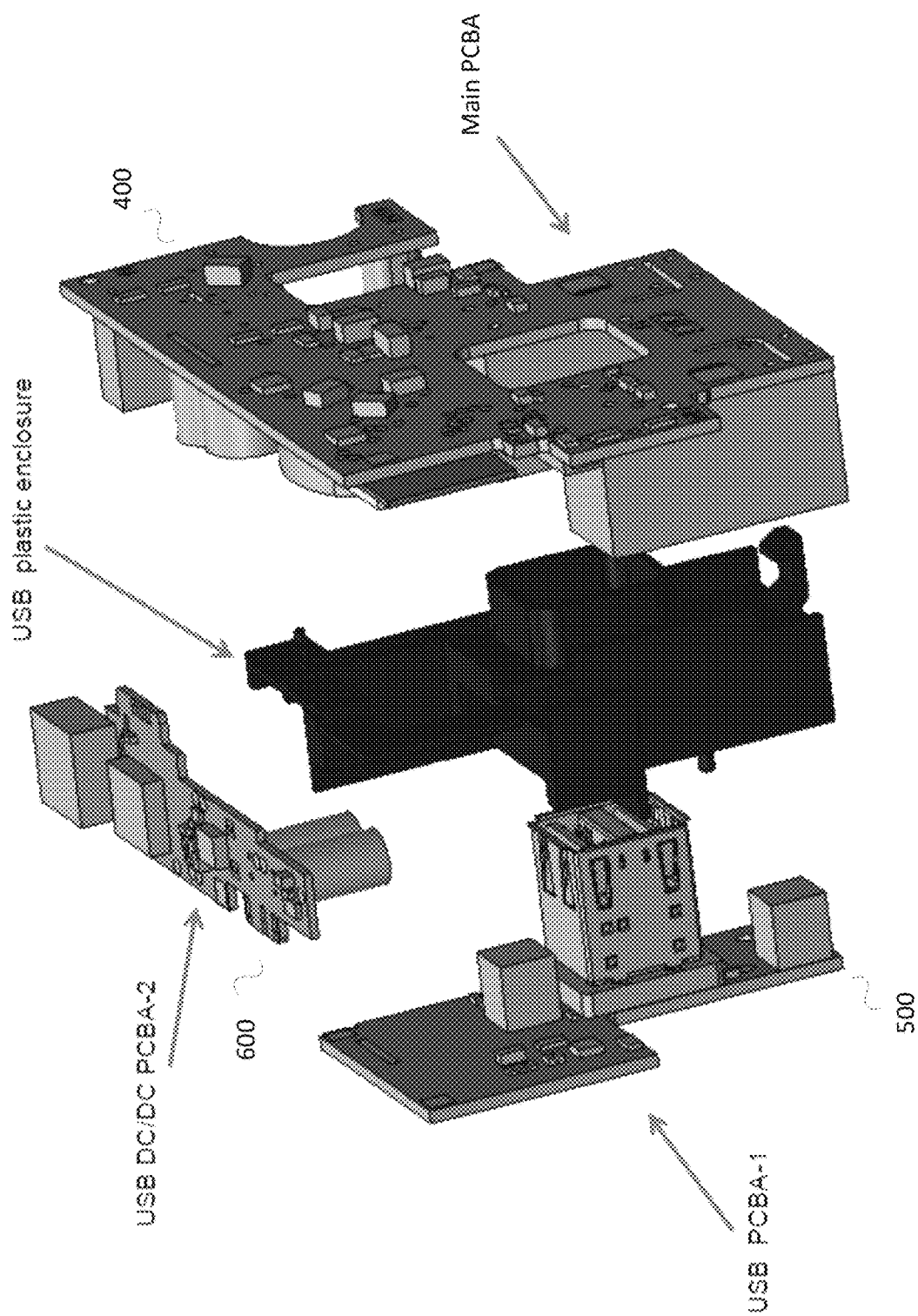
FIGS. 7A-E show an assembly and composite view of a smart socket with USB outlets in accordance with an embodiment.
Figure 7B:
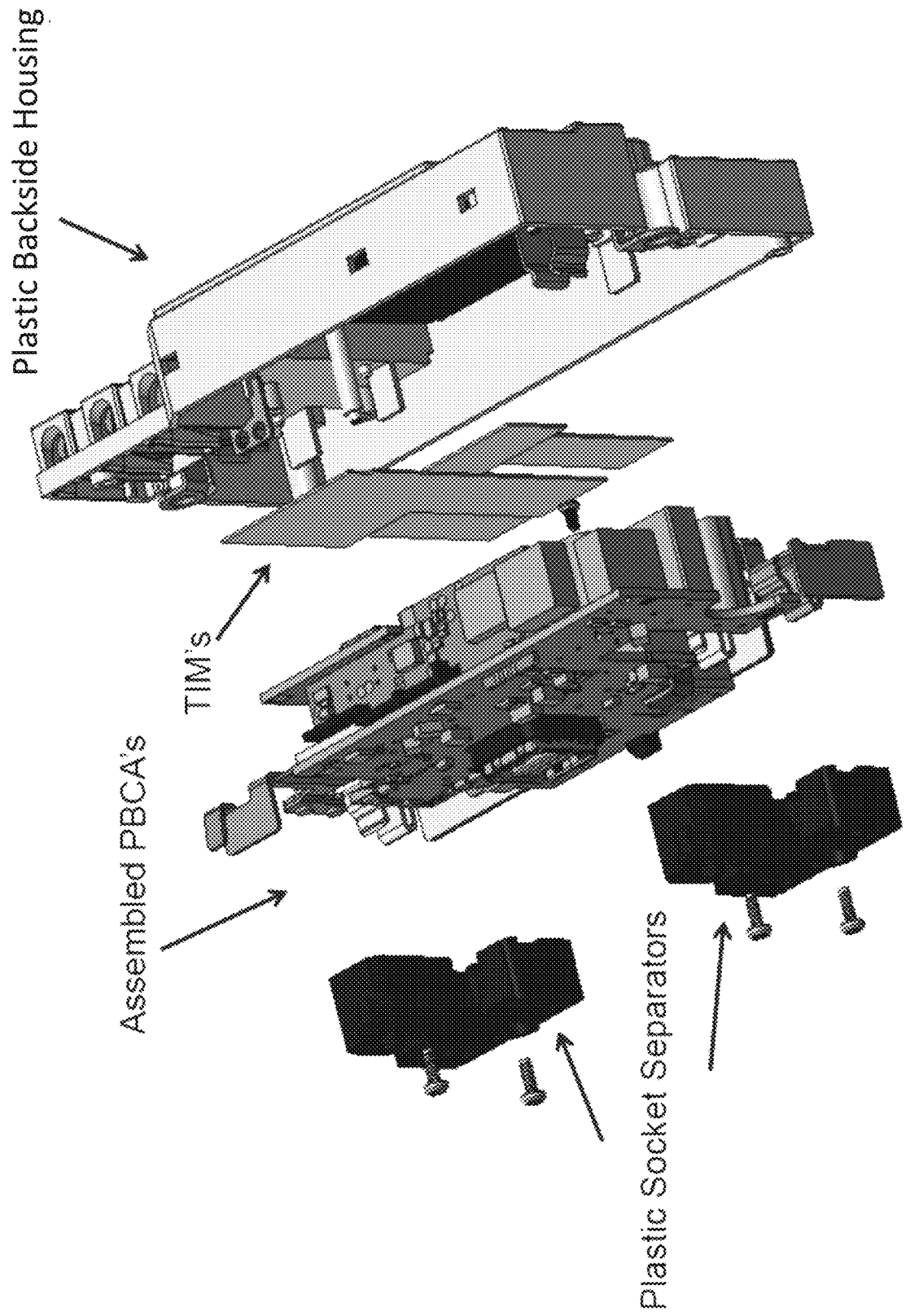
Figure 7C:
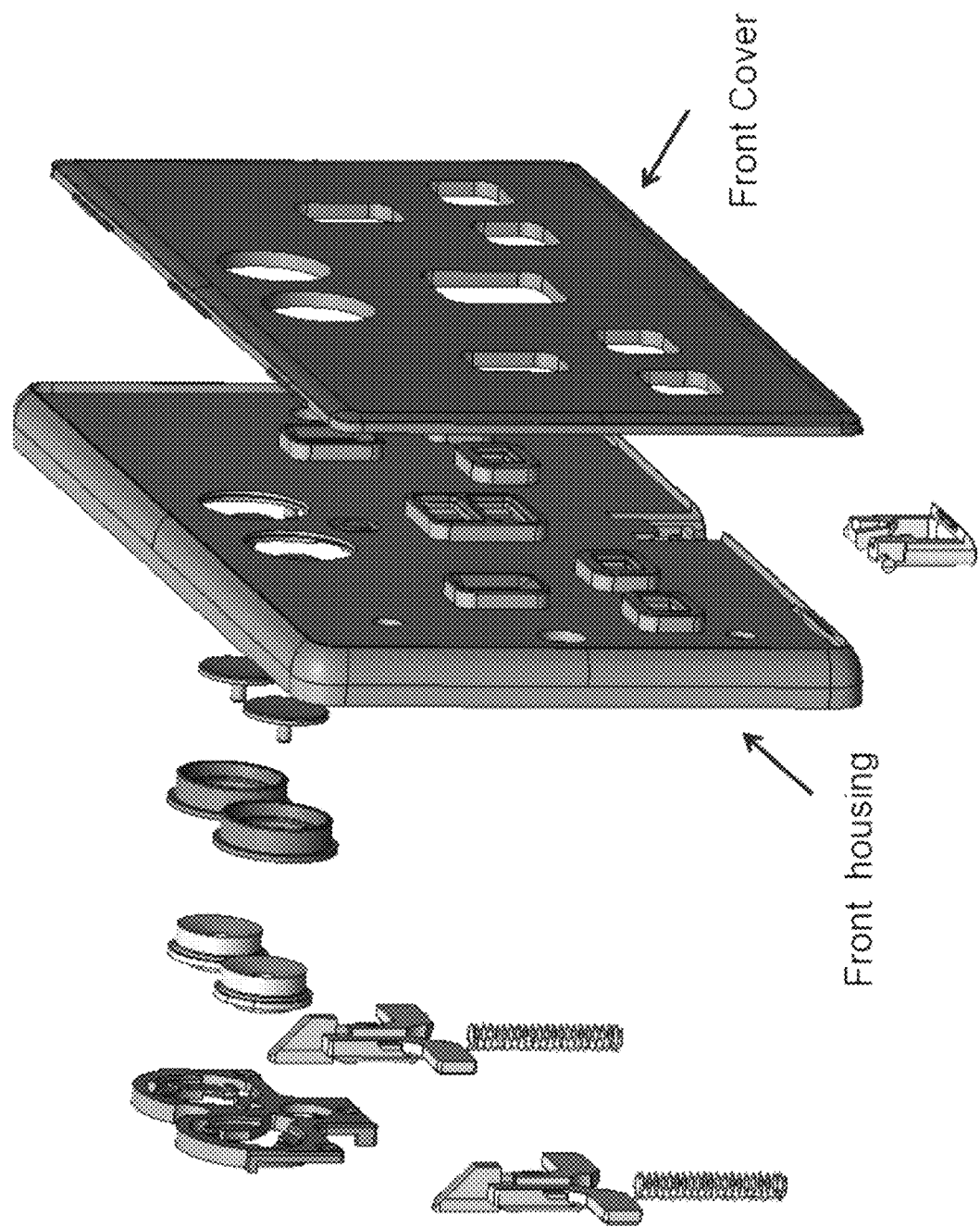
Figure 7D:
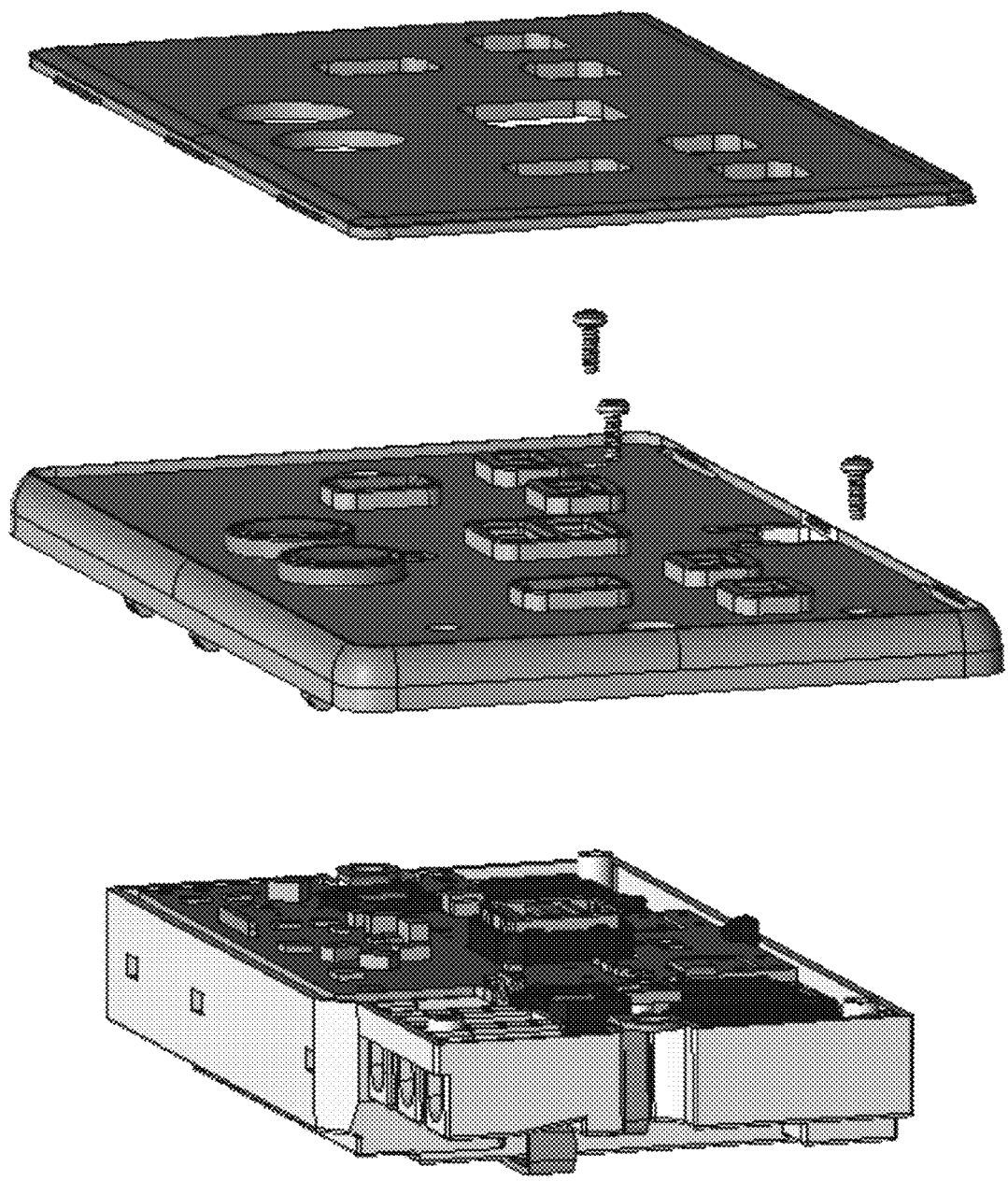
Figure 7E:
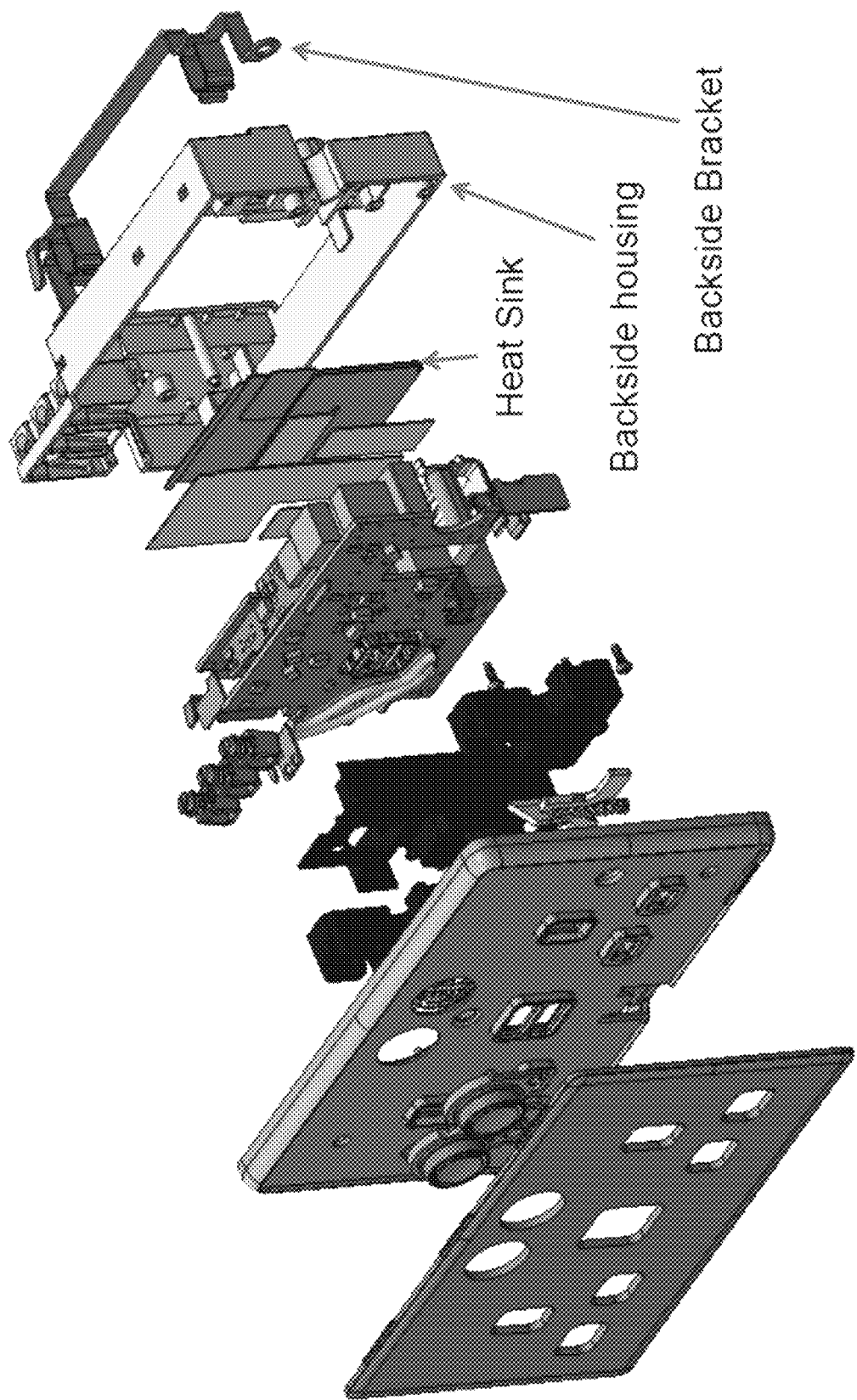

FIGS. 7A-E show an assembly and composite view of a smart socket with USB outlets in accordance with an embodiment. FIG. 7A shows three PCB assemblies with a USB plastic enclosure (housing). As shown in FIGS. 4-6, PCBA 400, PCBA 500, and PCBA 600 corresponds to the main PCBA, USB PCBA-1, and USB PCBA-2, respectively. FIG. 7B shows three PCB assemblies with a plastic socket separator and a plastic backside housing. FIG. 7C shows a front housing, front cover, and other housing assembly components. FIG. 7D shows a front housing, front cover, and back housing with three PCB assemblies. FIG. 7E shows a composite view of components of the smart socket with a USB outlet.

Figure 8A:
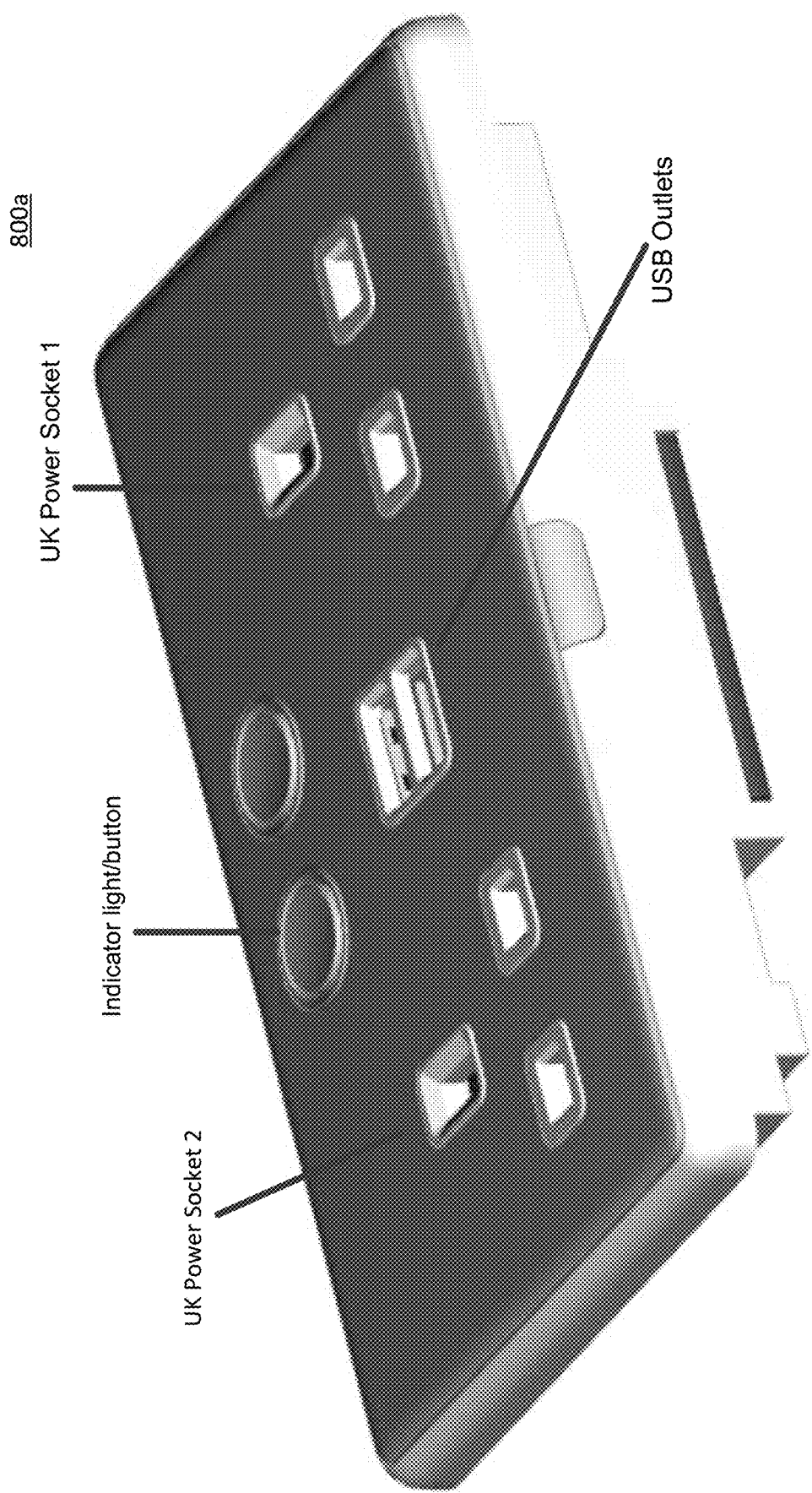
FIGS. 8A-B show top and backside views of a smart socket in accordance with an embodiment.
Figure 8B:
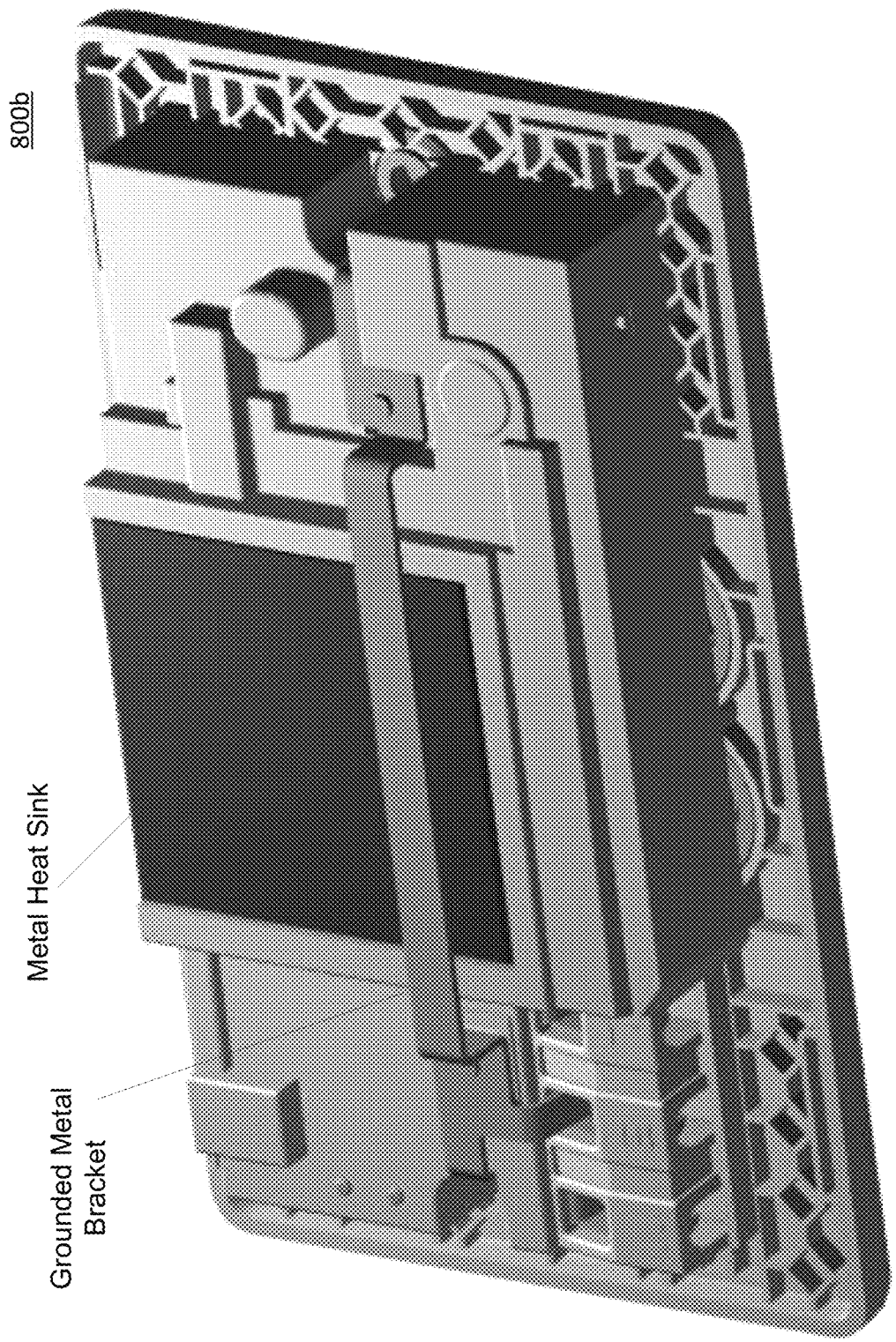

FIGS. 8A and 8B show top view 800a and back view 800b, respectively, of a smart socket.

Figure 9A:
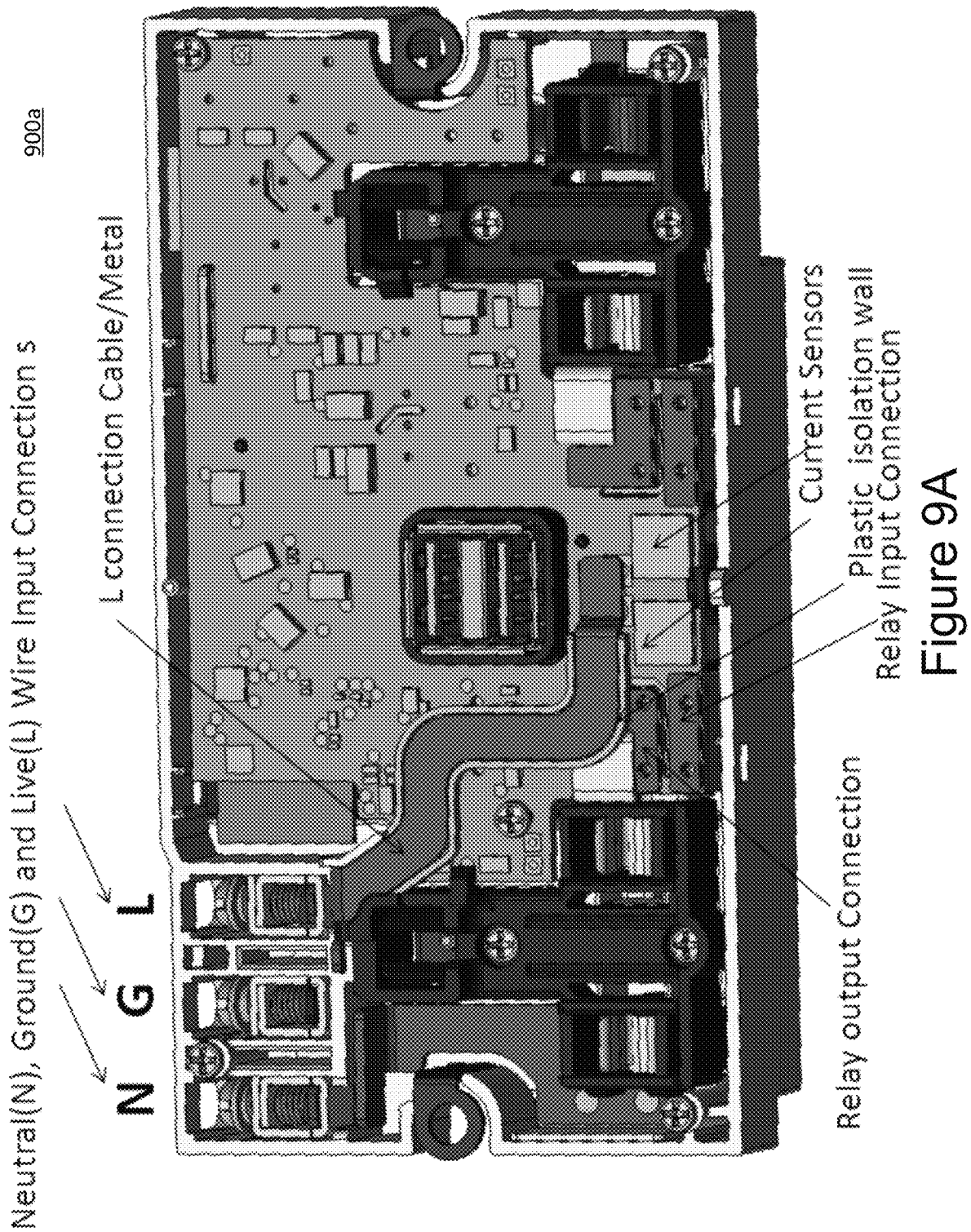
FIGS. 9A-C show a front PCBA view of a smart socket in accordance with an alternative embodiment of front surface metal plates.

FIG. 9A shows a top/front view 900a of a PCBA of a smart socket before applying a dielectric layer.

Figure 9B:
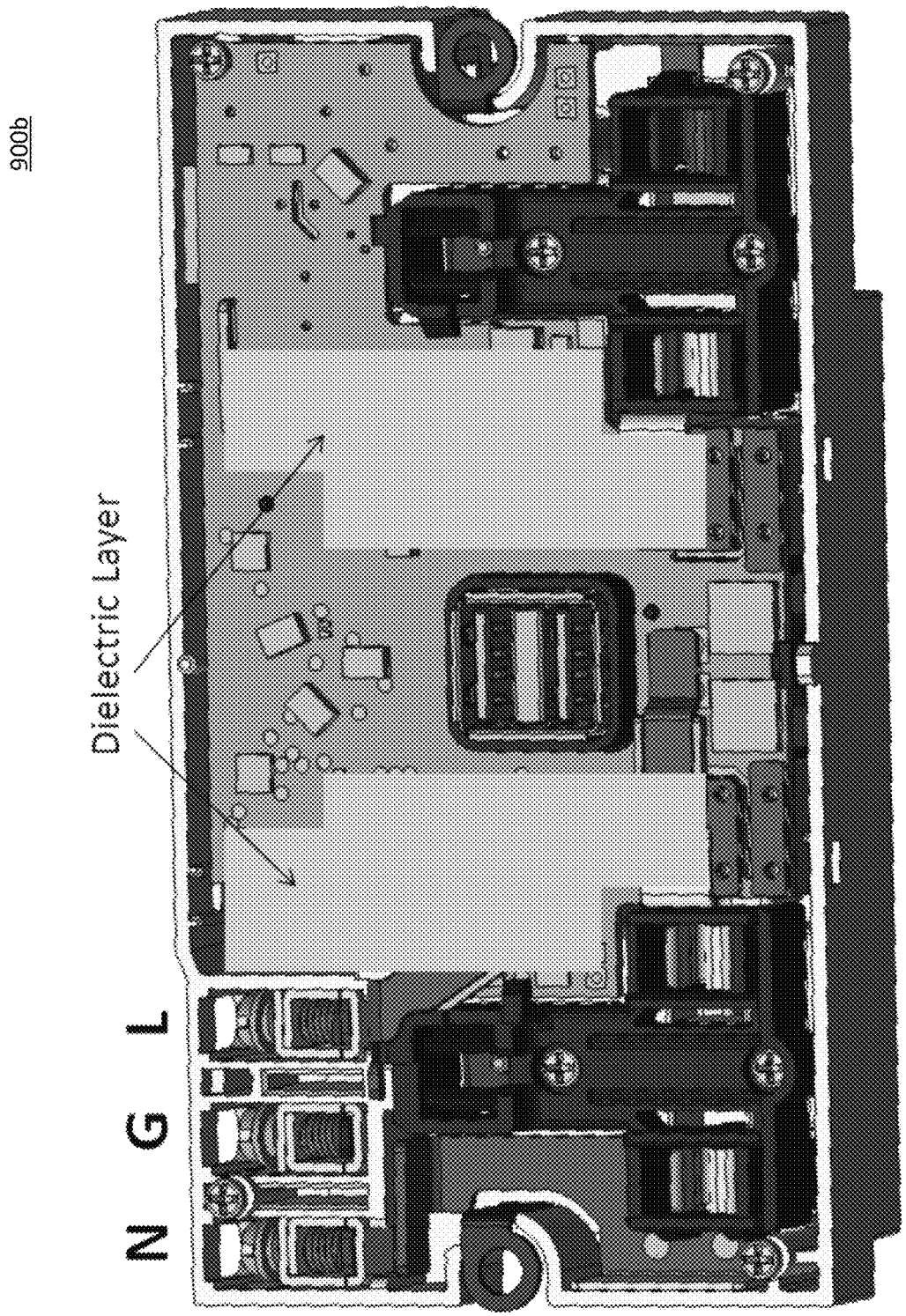

FIG. 9B shows a top/front view 900b of a PCBA of a smart socket with dielectric layers covering the PCBA surface before applying metal plates as heat sinks.

Figure 9C:
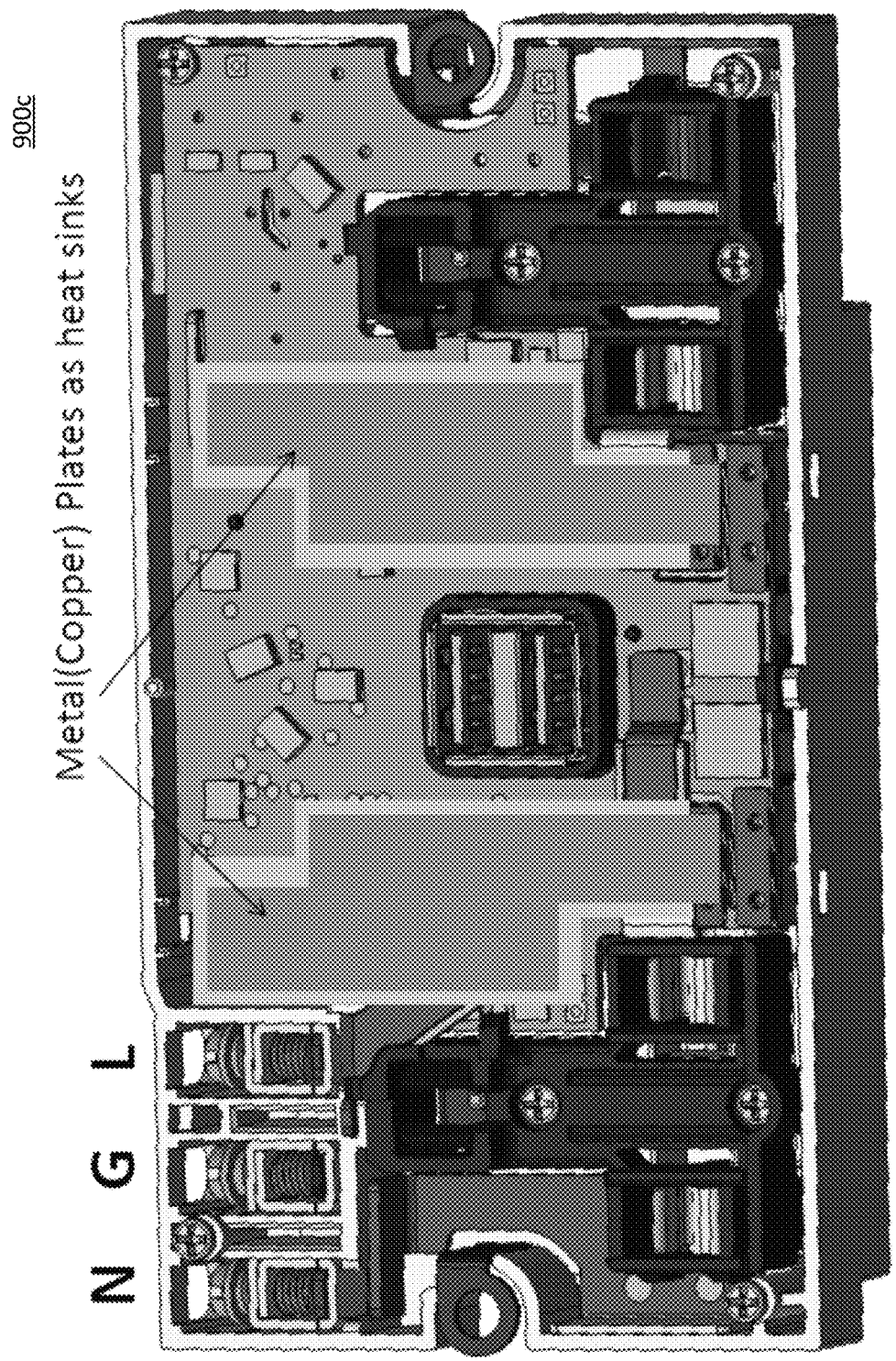

FIG. 9C shows a top/front view 900c of a PCBA of a smart socket with surface metal plates (for example, copper) functioning as front surface heat sinks. These metal plates are electrically coupled to Live (L) connection areas of relay outputs. With an alternative embodiment, metal plates are electrically coupled to output connection areas and are physically in contact with a front-side of a plastic housing.

With some embodiments, referring to FIGS. 1A-B, a smart socket 100a,100b may include a computing device (not explicitly shown) wherein processes may be executed. With some embodiments, a computing device may be included in the RF module as shown in FIG. 4A. The RF module may be used to receive instructions to turn the sockets on or off and to transmit power readings from each socket to an external electronic device such as a telephone instrument, smart phone, or a computer via a gateway.

The computing device may have a processor for controlling overall operation of the computing device and its associated components, including RAM, ROM, communications module, and memory device. For example, the computing device may be located in a module and may execute computer-executable instructions accessed from a flash memory.

The computing device typically includes a variety of computer readable media. Computer readable media may be any available media that may be accessed by computing device and include both volatile and nonvolatile media, removable and non-removable media. By way of example, and not limitation, computer readable media may comprise a combination of computer storage media and communication media.

Computer storage media may include volatile and nonvolatile, removable and non-removable media implemented in any method or technology for storage of information such as computer readable instructions, data structures, program modules or other data. Computer storage media include, but is not limited to, random access memory (RAM), read only memory (ROM), electronically erasable programmable read only memory (EEPROM), flash memory or other memory technology, CD-ROM, digital versatile disks (DVD) or other optical disk storage, magnetic cassettes, magnetic tape, magnetic disk storage or other magnetic storage devices, or any other medium that can be used to store the desired information and that can be accessed by the computing device.

Communication media typically embodies computer readable instructions, data structures, program modules or other data in a modulated data signal such as a carrier wave or other transport mechanism and includes any information delivery media. Modulated data signal is a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media.

The following embodiments describe innovative aspects that are directed to a smart socket. For example, one aspect reduces internal power dissipation and consequently avoids an internal temperature rise with respect to traditional approaches. Another aspect enhances the degree of safety when plugging or unplugging an attached electrical device (e.g., an appliance).

With a first embodiment, a smart socket structure comprises a relay, a power measurement IC, a current sensor, an RF module, an AC/DC converter, a microcontroller unit (MCU), at least one socket, a grounding metal bracket, and a plastic housing.

With a second embodiment, a smart socket comprises two sockets with two integrated USB outlets.

With a third embodiment, a smart socket comprises two smart sockets, where each socket has its own current sensor for energy measurement and reporting with both current sensors and relays on a Live (L) lines\ as shown in FIG. 1A.

With a fourth embodiment, a smart socket comprises sockets, where the sockets have a common current sensor for energy measurement and reporting with the common current sensor and relays on a Live (L) line as shown in FIG. 1B.

With a fifth embodiment, a smart socket comprises two smart sockets, where each socket has its own current sensor for energy measurement and reporting and with the current sensors on a Neutral (N) line and relays on a Live (L) line as shown in FIG. 1C.

With a sixth embodiment, a smart socket comprises sockets, where the sockets have a common current sensor for energy measurement and reporting with the common current sensor on a Neutral (N) line and relays on a Live (L) line as shown in FIG. 1D.

With a seventh embodiment, a smart socket comprises a synchronous rectifier (which may be referred to as an active rectifier) in the USB circuitry with short and wide PCB traces, where copper foils (sheets) further reduce the trace resistance.

With a eighth embodiment, a smart socket comprises multiple (for example, three in a shown embodiment) printed circuit board assemblies (PCBA's) comprising a main PCB assembly, a first USB PCB assembly, and a second USB PCB assembly with DC/DC conversion. The main PCB has relays, a power measurement IC, current sensor(s), a transformer for AC/DC conversion, and a hole for placement of USB sockets. The first USB PCBA has a USB socket and is placed within a space from the backside (the portion of the socket that goes into the wall), where the USB socket fits in the hole in the main PCB.

The second USB PCB assembly is placed in the gap between the main and the first USB PCBA's at one the one edge as shown in FIG. 3C.

With a ninth embodiment, a smart socket comprises thermal insulating material (TIM) placed on top of the first USB PCBA, relays and capacitor. On top, the TIM layer electrically insulates the PCBA's and its metal plate for heat sinking.

With a tenth embodiment, a smart socket comprises metal plates that are electrically coupled to a Live (L) line and relay output contacts in order to provide heat sinking. The metal plates are situated on the PCBA and are electrically isolated from the PCBA.

With eleventh embodiment, a smart socket comprises metal plates that function as surface heat sinks isolated from the PCBA surface with the exception of being electrically coupled to high temperature surface contact areas. The metal plates are physically in contact with a front surface of housing plastic.

With a twelfth embodiment, a smart socket comprises a socket with an integrated USB outlet.

With a thirteenth embodiment, socket insertions from brass for mechanical hardness may be welded with pure copper connection bars (for example with a thickness ranging from 0.25 mm-5 mm) to further reduce resistance.

With a fourteenth embodiment, one or more current sensor may be placed on an opposite side of the relays to reduce contact and trace resistances from an incoming AC line to current sensor and current sensor-relay input with copper bars/foils on top of the PCB traces.

With some embodiments, wireless communication in a smart socket allows energy dissipation to be measured and reported, for example via WiFi, BLE, and LoRA. Alternatively, wired communication may be used including G.Hn, BACNET, MODBUS, and the like.

Different current sensor arrangements allow measurement of an overall system energy dissipation as well as the energy dissipation in individual outlets (output sockets).

With some embodiments, heat dissipation may be enhanced by using a three-dimensional component placement concept to separate the greatest heat sources to different corners of a smart socket housing. For example, as shown in FIG. 3C, first PCBA (Main PCBA) 301 (including a transformer circuit, an AC relay and power measurement circuit), a second PCBA (USB PCBA 1) 302 (including a USB charging circuit), and a third PCBA (USB PCBA 2) 303 (including a power supply IC and MOSFET) may be placed at different locations of the housing. The placement of the PCBA's improves transfer and dispersion of heat generated by the smart electrical plug.

With some embodiments, overheating protection circuitry may be supported. The circuitry may detect an internal temperature (for example, near one of relays 104, 105 as shown in FIG. 1A) within a smart electrical plug. When the internal temperature is greater than a first predetermined temperature (for example, 70 degrees C.), a microcontroller unit (MCU) generates a signal to instruct the relay to cut off the AC output. Once the internal temperature drops below a second predetermined temperature (for example 60 degrees C.), the MCU sends another signal to instruct the relay to turn on so that the relay resumes the AC output.

In some embodiments, circuit design may reduce heat generation due to internal resistance within components by:
  Replacing the Schottky diodes with a synchronous rectifier (MOSFET)
  Replacing all low drop out (LDO) regulators by DC/DC convertors
  Using low contact resistance relays, with resistance <50 mOhm or even lower
  Shortening high current loop with widest copper sheet to reduce the trace resistances
  Placing copper bar and plate in the insulated area around the socket surface to increase heat dissipation As can be appreciated by one skilled in the art, a computer system with an associated computer-readable medium containing instructions for controlling the computer system can be utilized to implement the exemplary embodiments that are disclosed herein. The computer system may include at least one computer such as a microprocessor, digital signal processor, and associated peripheral electronic circuitry.

What is claimed is:

1. A smart electrical plug comprising:
    an electrical input coupler configured to electrically connect to an electrical power source, wherein the electrical power source includes a Live (L) line, a Neutral (N) line, and a Ground (G) line;
    a first electrical output socket;
    a second electrical output socket;
    an electrical current sensor arrangement configured to generate at least one signal indicative of a first electrical current through the first electrical output socket and a second electrical current through the second electrical output socket;
    a voltage divider electrical circuit configured to provide a first signal indicative of a voltage at the electrical input coupler;
    an electrical power measurement device configured to measure a measured electrical power based on the voltage and the at least one signal, the measured electrical power indicative of a first electrical power consumed through the first electrical output socket and a second electrical power consumed through the second electrical output socket;
    a communication interface electrically coupled to the electrical power measurement device and configured to transmit a communication signal, the communication signal indicative of the measured electrical power;
    at least one universal serial bus (USB) charging socket;
    a USB port controller configured to control an electrical output of the at least one USB charging socket;
    a temperature switch configured to:
        detect when an internal temperature within the smart electrical plug exceeds a first predetermined temperature; and
        in response to the detecting, generate a second signal to the USB port controller; and
        generate a third signal when the internal temperature is below a second predetermined temperature after previously exceeding the first predetermined temperature; and
    the USB port controller configured to:
        cut the electrical output of the at least one USB charging socket when the second signal is received from the temperature switch; and
        resume the electrical output of the at least one USB charging socket when the third signal is received from the temperature switch.

2. The smart electrical plug of claim 1, wherein the electrical current sensor arrangement comprises:
    a first current sensor configured to generate a fourth signal indicative of the first electrical current; and
    a second current sensor configure to generate a fifth signal indicative of the second electrical current.

3. The smart electrical plug of claim 2, wherein the first and second current sensors are coupled to the L line.

4. The smart electrical plug of claim 2, wherein the first and second current sensors are coupled to the N line.

5. The smart electrical plug of claim 1, wherein the electrical current sensor arrangement comprises:
    a single current sensor configured to:
        directly sense an aggregate of the first electrical current and the second electrical current; and
        generate a fourth signal indicative of the aggregate.

6. The smart electrical plug of claim 5, wherein the single current sensor is coupled to the L line.

7. The smart electrical plug of claim 5, wherein the single current sensor is coupled to the N line.

8. The smart electrical plug of claim 1, further comprising:
    at least two universal serial bus (USB) charging sockets.

9. The smart electrical plug of claim 8, wherein:
    a combined maximum current rating of the first and second electrical output sockets is approximately 20 amperes; and
    the smart electrical plug has maximum outside dimensions approximately equal to 149 mm (length) by 88 mm (width) by 30 mm (height).

10. The smart electrical plug of claim 9, wherein:
    a maximum single current rating of one of the first and second electrical output sockets is approximately 13 amperes.

11. The smart electrical plug of claim 1, wherein the communication interface comprises a wireless interface.

12. The smart electrical plug of claim 1, wherein the communication interface comprises a wired interface.

13. The smart electrical plug of claim 11, wherein the communication signal is indicative of a status of the smart electrical plug.

* * * * *

UNITED STATES PATENT AND TRADEMARK OFFICE
CERTIFICATE OF CORRECTION

PATENT NO. : 10,958,019 B2
APPLICATION NO. : 15/985187
DATED : March 23, 2021
INVENTOR(S) : Yilmaz et al.

Page 1 of 1

It is certified that error appears in the above-identified patent and that said Letters Patent is hereby corrected as shown below:

On the Title Page

Item (71) Applicant, Line 1:
Delete "Computime," and insert --Computime--

In the Specification

Column 1, Background of the Invention, Line 24:
Delete "stuart" and insert --smart--

Column 3, Detailed Description, Line 23:
Delete "106,107" and insert --106, 107--

Column 4, Detailed Description, Line 58:
Delete "100a,100b" and insert --100a, 100b--

Signed and Sealed this
Fourth Day of October, 2022

Katherine Kelly Vidal
*Director of the United States Patent and Trademark Office*